United States Patent
Wu

(10) Patent No.: US 11,612,065 B2
(45) Date of Patent: Mar. 21, 2023

(54) FOLDABLE DISPLAY MODULE AND FORMATION METHOD THEREOF, AND FOLDABLE DISPLAY DEVICE

(71) Applicant: Shanghai Tianma Micro-Electronics Co., Ltd., Shanghai (CN)

(72) Inventor: Shouzheng Wu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 17/348,948

(22) Filed: Jun. 16, 2021

(65) Prior Publication Data

US 2022/0322542 A1    Oct. 6, 2022

(30) Foreign Application Priority Data

Mar. 31, 2021   (CN) .................... 202110347947.X

(51) Int. Cl.
*H05K 5/00* (2006.01)
*H05K 5/02* (2006.01)

(52) U.S. Cl.
CPC ......... *H05K 5/0017* (2013.01); *H05K 5/0226* (2013.01)

(58) Field of Classification Search
None
See application file for complete search history.

(56) References Cited

U.S. PATENT DOCUMENTS

| 2011/0307102 A1* | 12/2011 | Czamara | H05K 7/1497 700/282 |
| 2011/0316337 A1* | 12/2011 | Pelio | H05K 7/1492 307/24 |
| 2012/0092811 A1* | 4/2012 | Chapel | H02B 1/04 361/622 |
| 2016/0021793 A1* | 1/2016 | Chen | H05K 7/202 361/679.02 |
| 2017/0013745 A1* | 1/2017 | Wilcox | H05K 7/20745 |

(Continued)

FOREIGN PATENT DOCUMENTS

| CN | 106486010 A | 3/2017 |
| CN | 110827680 A | 2/2020 |

(Continued)

*Primary Examiner* — Anthony Q Edwards
*Assistant Examiner* — Rashen E Morrison
(74) *Attorney, Agent, or Firm* — Anova Law Group PLLC

(57) ABSTRACT

A foldable display module and its formation method, and a foldable display device are provided in the present disclosure. The module includes a foldable display panel and a support plate which are disposed oppositely. The support plate includes a first support part and a second support part; the first support part is made of a first material; and the second support part is made of a second material; the foldable display module includes a bendable region and a non-bendable region; the foldable display panel includes a bendable portion and a non-bendable portion; the bendable portion is at the bendable region; and the non-bendable portion is at the non-bendable region; the first support part includes a first portion configured to support the bendable portion of the foldable display panel; and the second support part is configured to support the non-bendable portion of the foldable display panel.

20 Claims, 30 Drawing Sheets

(56) References Cited

U.S. PATENT DOCUMENTS

| | | | |
|---|---|---|---|
| 2017/0359917 A1* | 12/2017 | Bailey | H05K 7/1485 |
| 2019/0171799 A1* | 6/2019 | Crawford | G06F 21/31 |
| 2019/0261534 A1* | 8/2019 | Jochim | H05K 7/20781 |
| 2020/0146186 A1* | 5/2020 | Fotouh | E04B 2/7401 |
| 2020/0265175 A1* | 8/2020 | Martin | G06F 3/04815 |
| 2021/0076529 A1* | 3/2021 | Pachoud | H04L 41/24 |
| 2021/0200276 A1* | 7/2021 | Lee | G06F 1/1616 |
| 2021/0219460 A1* | 7/2021 | Bailey | H05K 7/1481 |

FOREIGN PATENT DOCUMENTS

| | | |
|---|---|---|
| CN | 211479555 U | 9/2020 |
| CN | 112365802 A | 2/2021 |

* cited by examiner

FOLDABLE DISPLAY MODULE AND FORMATION METHOD THEREOF, AND FOLDABLE DISPLAY DEVICE

CROSS-REFERENCE TO RELATED APPLICATION

This application claims the priority of Chinese Patent Application No. 202110347947.X, filed on Mar. 31, 2021, the content of which is incorporated herein by reference in its entirety.

TECHNICAL FIELD

The present disclosure generally relates to the field of display technology and, more particularly, relates to a foldable display module and its formation method, and a foldable display device.

BACKGROUND

In recent years, with the development of electronic and semiconductor technologies, the requirements for miniaturization and visualization of electronic devices, such as mobile phones, media players, game consoles, and digital cameras and the like, have become higher. That is, on the one hand, users need the storage volume of the electronic device to be as small as possible, thereby being easy to carry such device; on the other hand, the users also need the visual effect of the electronic device to be ensured, for example, the area of the display screen may not be reduced due to the reduction in the storage volume of the electronic device. Therefore, there is a need to implement a foldable display device to ensure that the volume of the electronic device is reduced after being folded and stored, and the visualization effect after being unfolded is desirable (for example, a large-sized display screen). The electronic device with a foldable display screen has gained wide popularity, where the foldable screen may be unfolded when in use to provide a larger display area, and the foldable screen may be switched to a folded state when not in use, which is convenient for users to carry and improves the portability of the display device.

Currently, the folding technology has been used in notebooks, mobile phones, pads, and roll-up TVs. Stainless-steel or alloy materials, such as 301 stainless steel, 304 stainless steel and the like with a thickness ranging from 25 μm to 200 μm, may be used as the support structures of the foldable display screens. However, for the medium/large-sized display technology, the weight drawback of the support structure using the stainless-steel or alloy material has gradually become noticeable. In order to reduce module weight, the current used technique is to hollowed structure out the relevant support structure. However, the hollowing process may easily lead to uneven attachment surface, which may make the uneven attachment drawback become noticeable, reduce the support performance and damage the mechanical performance of a pre-manufactured machine. If the related support structure is thinned, due to its own pressing and stretching stress, the support structure may be easy to be warped during chemical thinning, which may make the support structure not easy to be fabricated.

Therefore, there is a need to provide a foldable display module and its fabrication method, and a foldable display device which may not only reduce the module weight, but also have desirable flatness.

SUMMARY

One aspect of the present disclosure provides a foldable display module. The display module includes a foldable display panel and a support plate which are disposed oppositely. The support plate is on a side away from a light-exiting surface of the foldable display panel; the support plate includes a first support part and a second support part; the first support part is made of a first material; and the second support part is made of a second material; the foldable display module includes a bendable region and a non-bendable region; the foldable display panel includes a bendable portion and a non-bendable portion; the bendable portion is at the bendable region; and the non-bendable portion is at the non-bendable region; the first support part includes a first portion configured to support the bendable portion of the foldable display panel; the second support part is configured to support the non-bendable portion of the foldable display panel; and the first support part is in contact with the second support part.

Another aspect of the present disclosure provides a foldable display device. The display device includes a housing and a foldable display module comprising a foldable display panel and a support plate which are disposed oppositely. The support plate is on a side away from a light-exiting surface of the foldable display panel; the support plate includes a first support part and a second support part; the first support part is made of a first material; and the second support part is made of a second material; the foldable display module includes a bendable region and a non-bendable region; the foldable display panel includes a bendable portion and a non-bendable portion; the bendable portion is at the bendable region; and the non-bendable portion is at the non-bendable region; the first support part includes a first portion configured to support the bendable portion of the foldable display panel; the second support part is configured to support the non-bendable portion of the foldable display panel; the first support part is in contact with the second support part; and the foldable display module is fixed to the housing.

Another aspect of the present disclosure provides a formation method of a foldable display module. The method includes providing a first film layer made of a first material and patterning the first film layer to form a first support part; providing a second material to form a second support part through an injection molding process, where the second support part is in contact with the first support part; and the first support part and the second support part form a support plate; and providing a foldable display panel and attaching the foldable display panel to the support plate.

Other aspects of the present disclosure can be understood by those skilled in the art in light of the description, the claims, and the drawings of the present disclosure.

BRIEF DESCRIPTION OF THE DRAWINGS

The drawings incorporated in the specification and constituting a part of the specification illustrate various embodiments of the present disclosure and together with the description are used to explain the principle of the present disclosure.

DETAILED DESCRIPTION

Figure 1:
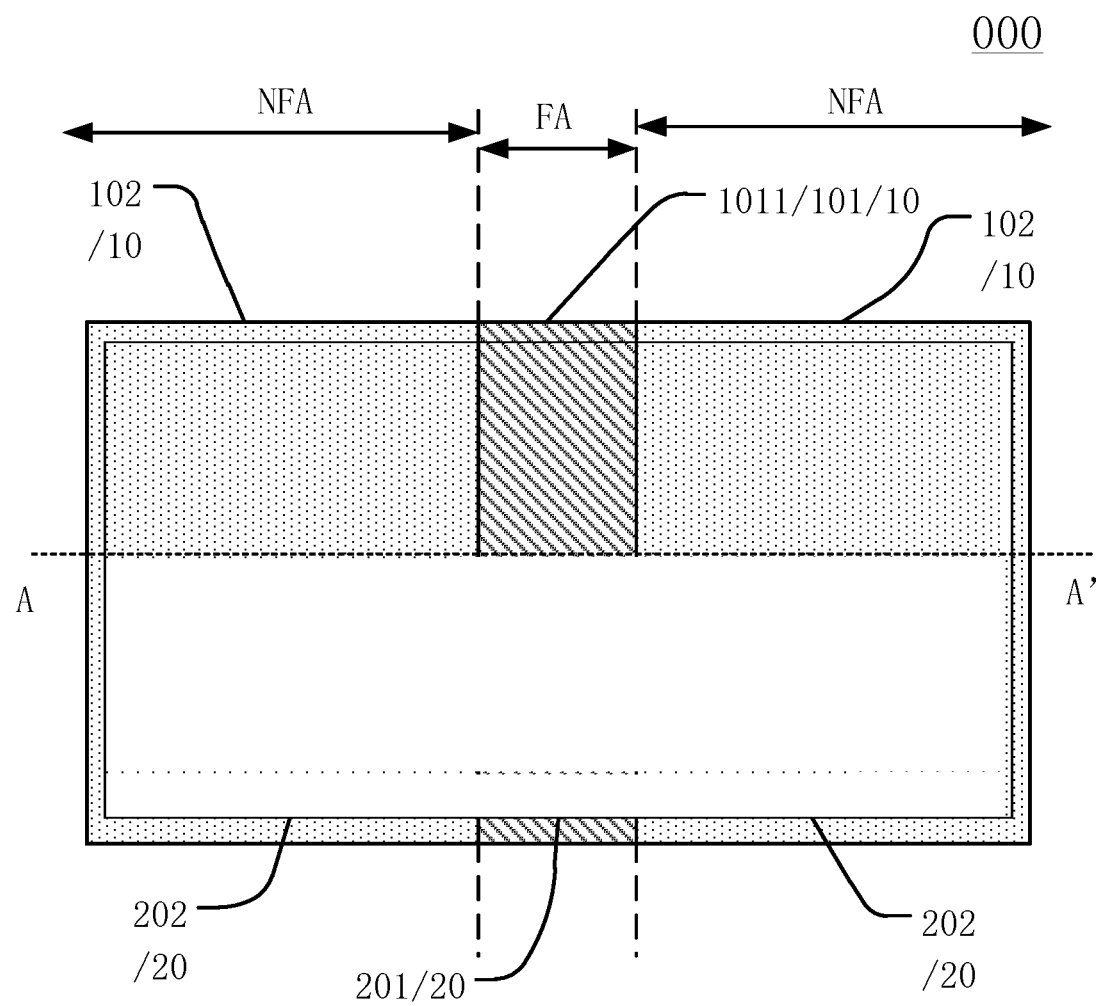
FIG. 1 illustrates a planar structural schematic of a foldable display module according to various embodiments of the present disclosure.

Various exemplary embodiments of the present disclosure are described in detail with reference to the accompanying drawings. It should be noted that unless stated otherwise, the relative arrangement of components and steps, numerical expressions and numerical values set forth in those embodiments may not limit the scope of the present disclosure.

The following description of at least one exemplary embodiment may be merely illustrative, and may not serve as any limitation to the present disclosure and application or use thereof.

The technologies, methods, and equipment known to those skilled in the art may not be discussed in detail, but where appropriate, the technologies, methods, and equipment should be regarded as a part of the specification.

In all examples shown and discussed herein, any specific value should be interpreted as merely exemplary, rather than as a limitation. Therefore, other examples of various exemplary embodiments may have different values.

It should be noted that similar reference numerals and letters indicate similar items in the following drawings. Therefore, once an item is defined in one drawing, it does not need to be further discussed in the subsequent drawings.

Figure 2:
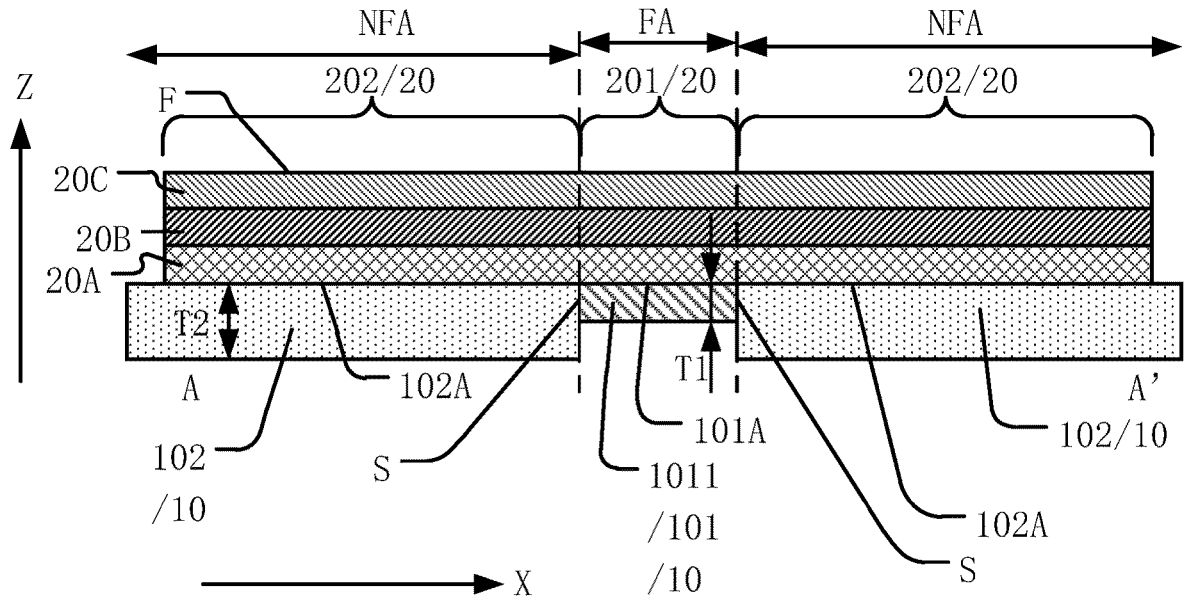
FIG. 2 illustrates a cross-sectional structural schematic along an A-A' direction in FIG. 1.

Referring to FIGS. 1-2, FIG. 1 illustrates a planar structural schematic of a foldable display module according to various embodiments of the present disclosure; and FIG. 2 illustrates a cross-sectional structural schematic along an A-A' direction in FIG. 1. In order to clearly illustrate the structure in one embodiment, transparency filling may be performed on the foldable display panel in FIG. 1. A foldable display module 000 provided in one embodiment may include a foldable display panel 20 (for illustrative purpose, as shown in FIG.1, the rectangular foldable display panel 20 is illustrated by a filled pattern, and the degree of the transparency in the foldable display panel 20 is adjusted to make the filled pattern semi-transparent) and a support plate 10 which are disposed oppositely, where the support plate 10 may be located on the side away from a light-exiting surface F of the foldable display panel 20.

The support plate 10 may include a first support part 101 and a second support part 102; the first support part 101 may be made of a first material; and the second support part 102 may be made of a second material.

The foldable display module 000 may include a bendable region FA and a non-bendable region NFA.

The foldable display panel 20 may include a bendable portion 201 and a non-bendable portion 202; the bendable portion 201 may be located in the bendable region FA; and the non-bendable portion 202 may be located in the non-bendable region NFA.

The first support part 101 may include a first portion 1011, and the first portion 1011 may be used to support the bendable portion 201 of the foldable display panel 20.

The second support part 102 may be used to support the non-bendable portion 202 of the foldable display panel 20.

The first support part 101 may be in contact with the second support part 102.

For example, the foldable display module 000 provided in one embodiment may include the foldable display panel 20 and the support plate 10 for supporting the foldable display panel 20. The support plate 10 may be located on the side away from the light-exiting surface F of the foldable display panel 20.

The foldable display panel 20 in one embodiment may be a flexible display panel, and may at least include a flexible substrate 20A, an organic light-emitting layer 20B, and a flexible cover 20C which are sequentially stacked. The flexible substrate 20A may be located on the side adjacent to the support plate 10 and used to support all film structures of the foldable display panel 20. The organic light-emitting layer 20B may be used to dispose a plurality of organic light-emitting diodes to emit visible light; and the flexible cover plate 20C may be used to cover the organic light-emitting layer 20B, thereby protecting the entire foldable display panel 20.

Figure 3:
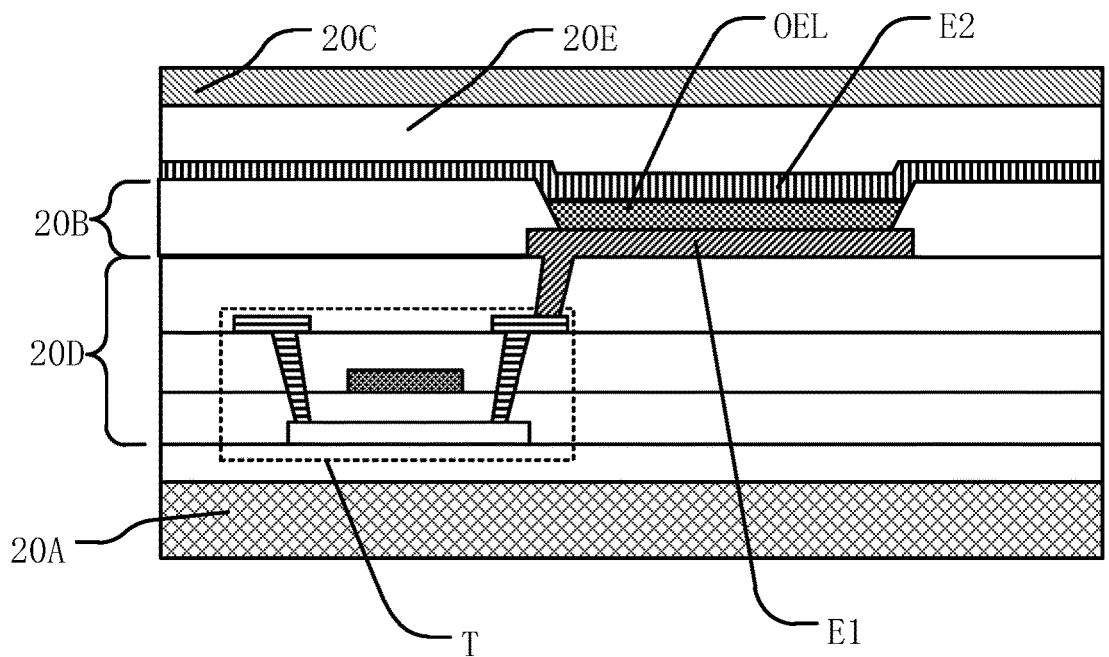
FIG. 3 illustrates a local cross-sectional structural schematic of a foldable display panel in FIG. 2.

Optionally, referring to FIGS. 2-3, FIG. 3 illustrates a local cross-sectional structural schematic of the foldable display panel in FIG. 2. The flexible substrate 20A of the foldable display panel 20 may include a thin film transistor array layer 20D. The thin film transistor array layer 20D may be disposed with a plurality of thin film transistors T. The organic light-emitting layer 20B may be located on the side of the thin film transistor array layer 20D away from the flexible substrate 20A. The organic light-emitting layer 20B may be disposed with a plurality of light-emitting devices which may be organic light-emitting diodes (as shown in FIGS. 2-3) or inorganic light-emitting diodes. The light-emitting device may include a first electrode E1, a second electrode E2, and an organic light-emitting layer OEL disposed between the first electrode E1 and the second electrode E2. Optionally, the first electrode E1 may be an anode electrode, the second electrode E2 may be a cathode electrode, and the drain electrode of the thin film transistor T may be electrically connected to the first electrode E1. The side of the organic light-emitting layer 20B away from the flexible substrate 20A may further include a thin film encapsulation layer 20E. Optionally, the thin film encapsulation layer 20E may be at least a stacked structure of an inorganic layer, an organic layer, and an inorganic layer (not shown in FIG. 3). The flexible cover 20C may be located on the side of the thin film encapsulation layer 20E away from the flexible substrate 20A.

The foldable display module 000 may include the bendable region FA and the non-bendable region NFA. The foldable display panel 20 may include the bendable portion 201 and the non-bendable portion 202; the bendable portion 201 may be located in the bendable region FA; and the non-bendable portion 202 may be located in the non-bendable region NFA. FIG. 2 illustrates a case where the foldable display module 000 includes two non-bendable regions NFA and one bendable region FA; and the bendable region FA is located between the two non-bendable regions NFA. When the foldable display module 000 is bent, the bendable portion 201 of the foldable display panel 20 may also be bent.

The support plate 10 in one embodiment may include the first support part 101 and the second support part 102. The material of the first support part 101 may include a first material, and the material of the second support part 102 may include a second material. Optionally, the first material may be a metal alloy material, such as SUS304 stainless steel, SUS301 stainless steel, titanium alloy, copper alloy and the like with a relatively high density; and the second material may be a light-weight material, such as PMMA (polymethyl methacrylate), PC (polycarbonate), carbon fiber board and the like with a relatively low density.

The first support part 101 may include at least the first portion 1011, the first portion 1011 may be used to support the bendable portion 201 of the foldable display panel 20, and the second support part 102 may be used to support the non-bendable portion 202 of the foldable display panel 20. Optionally, the bendable performance of the first portion 1011 may be greater than the bendable performance of the second support part 102, such that the first portion 1011 may support the bendable portion 201 of the foldable display panel 20, and the folding effect of the foldable display module 000 in the bendable region FA may also be implemented.

In one embodiment, the first support part 101 may be in contact with the second support part 102. Optionally, the contact surface of the first support part 101 and the second support part 102 in one embodiment may include a contact surface S which intersects with the support surface of the support plate 10 for supporting the foldable display panel 20 (the contact surface S shown in FIG. 2). The first support part 101 and the second support part 102 made of different materials may be arranged along an extension direction X (as shown in FIG. 2) of the foldable display panel 20; and the first support part 101 and the second support part 102 may jointly form the support plate 10 for supporting the foldable display panel 20.

Figure 4:
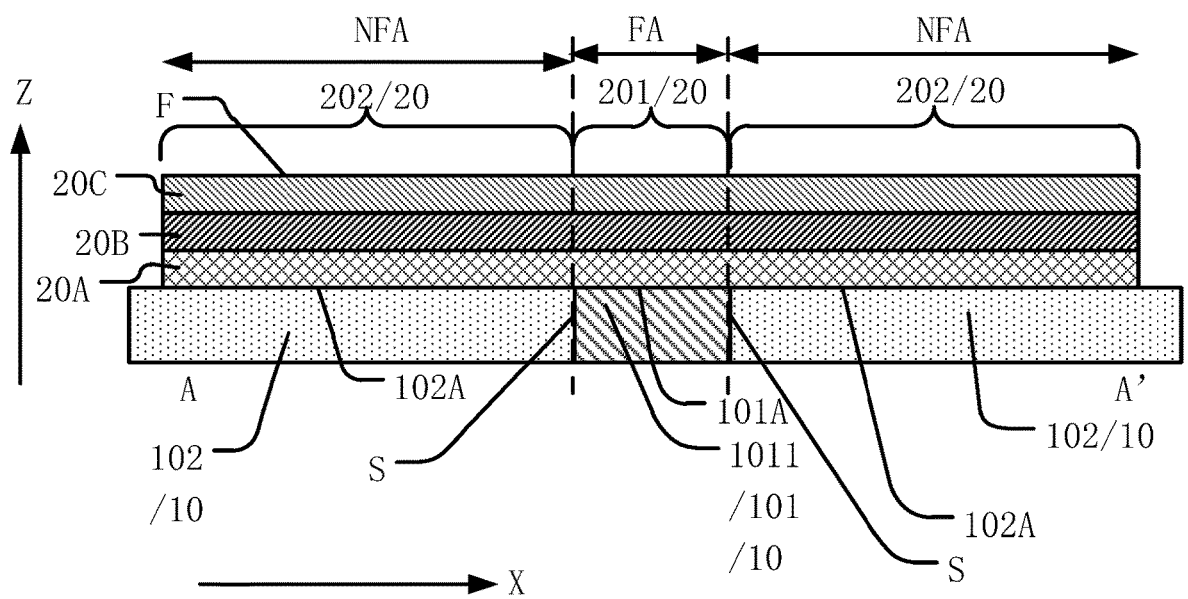
FIG. 4 illustrates another cross-sectional structural schematic along an A-A' direction in FIG. 1.

The thickness of the second support part 102 may be greater than or equal to the thickness of the first support part 101. As shown in FIG. 2, a thickness T2 of the second support part 102 may be configured to be greater than a thickness T1 of the first support part 101. The second support part 102 may not only support the foldable display panel 20, but also may ensure that the portion of the foldable display panel 20 supported by the second support part 102 does not bend. Compared with using a whole support film layer to support the foldable display panel, the structure in which the support plate is attached to the back of the support film layer may simplify the configuration of the support structure of the foldable display panel. As shown in FIG. 4, FIG. 4 illustrates another cross-sectional structural schematic along an A-A' direction in FIG. 1. The thickness of the second support part 102 may be equal to the thickness of the first support part 10, such that the first support part 101 and the second support part 102 made of different materials may jointly form the flat support plate 10, thereby ensuring the support performance of the foldable display panel 20.

In one embodiment, the support plate 10 may include two different materials, and the first support part 101 and the second support part 102 made of two different materials may be used to jointly support the foldable display panel 20. By configuring the second support part 102 made of the second material, not only the weight of the entire module can be reduced, but also the support plate 10 can have desirable support performance in the non-bendable region NFA. Furthermore, by configuring the first support part 101 made of the first material, the foldable display module 000 may have desirable flatness in the bendable region FA, which may reduce the module weight and make the module have desirable flatness and bendability as possible.

It should be understood that, in one embodiment, the first support part 101 including the first portion 1011 may be exemplarily illustrated in FIGS. 1-2. The first portion 1011 may be located in the bendable region FA of the foldable display module 000 and used to support the bendable portion 201 of the foldable display panel 20. The second support part 102 may be located in the non-bendable region NFA of the foldable display module 000 and used to support the non-bendable portion 202 of the foldable display panel 20. The first support part 101 and the second support part 102 may be in contact with each other and connected to form the structure of the support plate 10.

In other embodiments, the first support part 101 may further include a portion located in the non-bendable region NFA.

Figure 5:
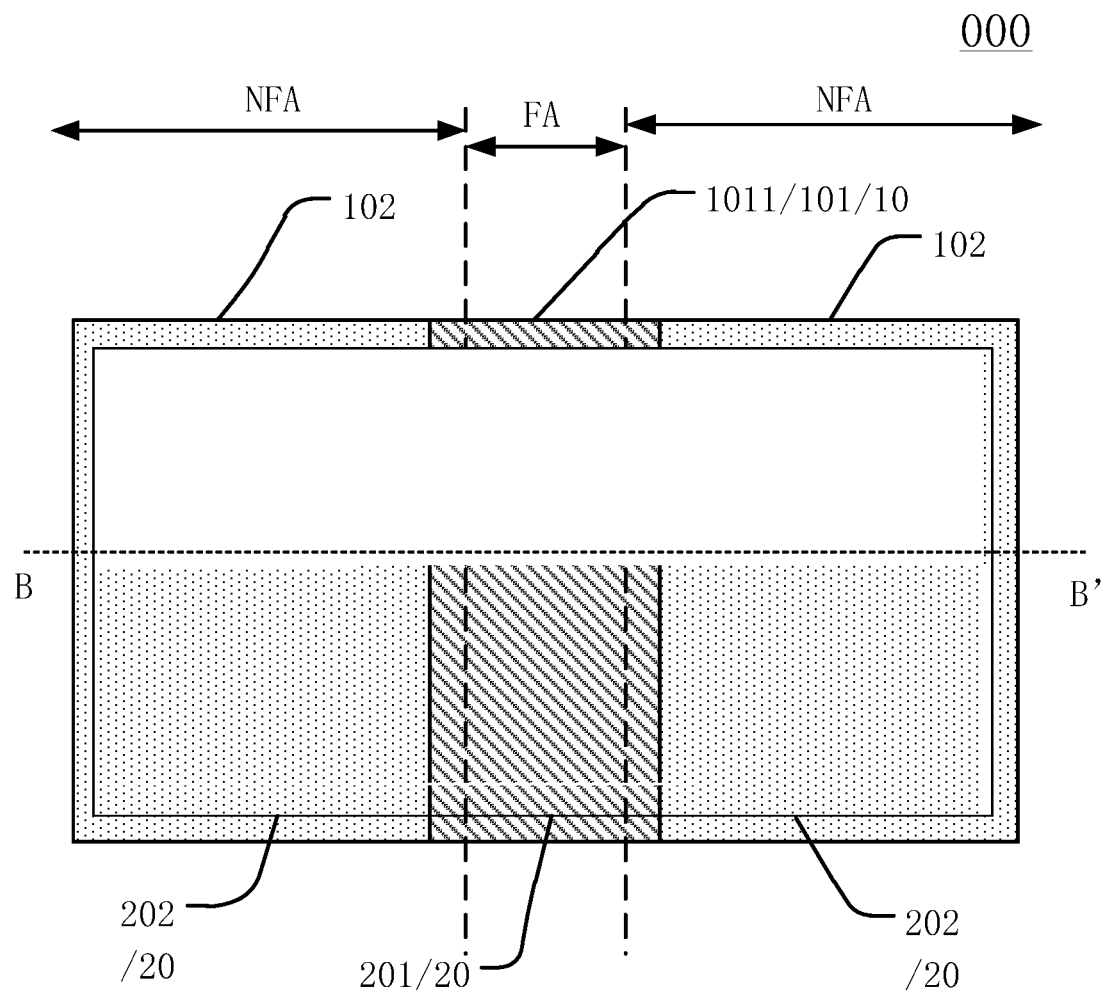
FIG. 5 illustrates a planar structural schematic of another foldable display module according to various embodiments of the present disclosure.
Figure 6:
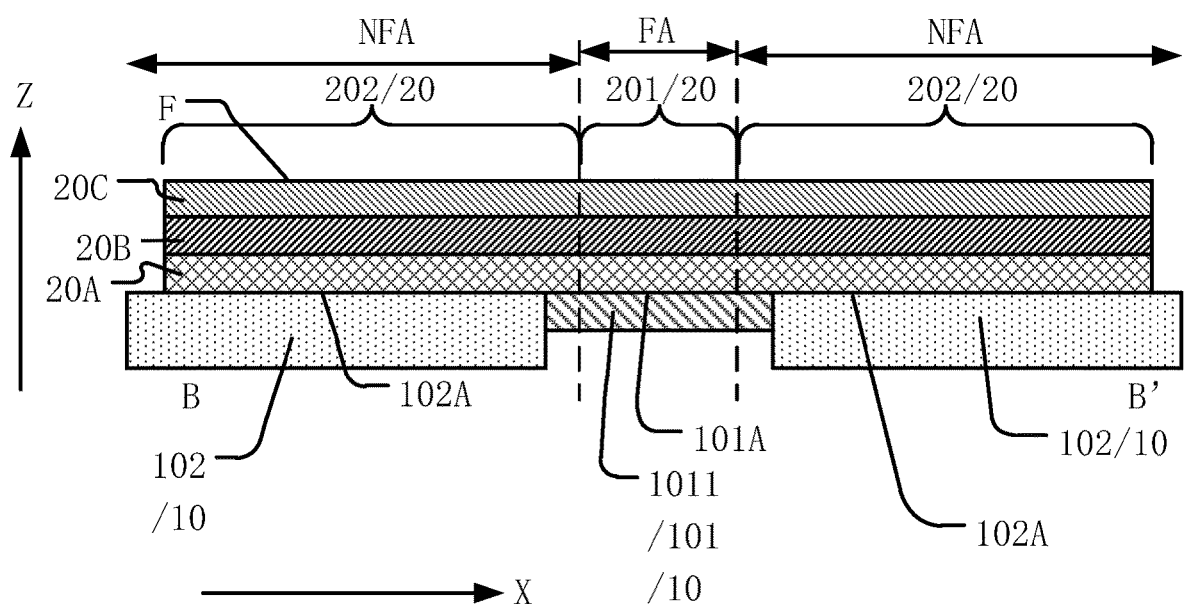
FIG. 6 illustrates a cross-sectional structural schematic along a B-B' direction in FIG. 5.

Optionally, the implementation manner of the support plate 10 may also be illustrated in FIGS. 5-6. FIG. 5 illustrates a planar structural schematic of another foldable display module according to various embodiments of the present disclosure; and FIG. 6 illustrates a cross-sectional structural schematic along a B-B' direction in FIG. 5. In order to clearly illustrate the structure in one embodiment, the transparency filling may be performed on the foldable display panel in FIG. 5. The first portion 1011 of the first support part 101 may not only include a portion located in the bendable region FA of the foldable display module 000 to support the bendable portion 201 of the foldable display panel 20, but also include a portion located in the non-bendable region NFA. The second support part 102 may be located in the non-bendable region NFA of the foldable display module 000 and used to support the non-bendable portion 202 of the foldable display panel 20. The first support part 101 and the second support part 102 may be in contact with each other and connected to form the structure of the support plate 10. A partial structure of the first support part 101 may be configured to cross the boundary line between the bendable region FA and the non-bendable region NFA and extend to the non-bendable region NFA. When the foldable display module 000 is bent, the stress at the boundary between the bendable region FA and the non-bendable region NFA may be relatively large, Therefore, the partial structure of the first support part 101 may be configured to cross the boundary line between the bendable region FA and the non-bendable region NFA, such that the position with relatively large stress during the bending process may not be configured at the location where two different materials are connected, such that the first support part 101 may play a transition role. Meanwhile, the bending performance of the material of the first support part 101 may be better than that of the second support part 102. Therefore, the first support part may withstand the stress at the boundary between the bendable region FA and the non-bendable region NFA during the bending process as possible, which may avoid damage to the support plate 10 and the foldable display panel.

For the contact connection manner of the first support part 101 and the second support part 102, it may be selected from a clamping fixation, an adhesive fixation, or other contact connection manners which may satisfy that the first support part 101 and the second support part 102 are in contact with each other to be fixedly connected.

In one embodiment, the foldable display module 000 may include the bendable region FA and two non-bendable regions NFA. Two non-bendable regions NFA may be symmetrically connected to opposite sides of the bendable region FA, and the shapes and sizes of two non-bendable regions NFA may be same as an example for illustration. In other embodiments, the shapes and sizes of two non-bendable regions NFA may be different; or the foldable display module 000 may also include a plurality of bendable regions FA and a plurality of non-bendable regions NFA, for example, the number of bendable regions FA may be two, and the number of non-bendable regions NFA may be three and the like; and the bendable region FA may be located between two adjacent non-bendable regions NFA, and the shapes and sizes of the plurality of non-bendable regions NFA may be different from each other or same.

Figure 7:
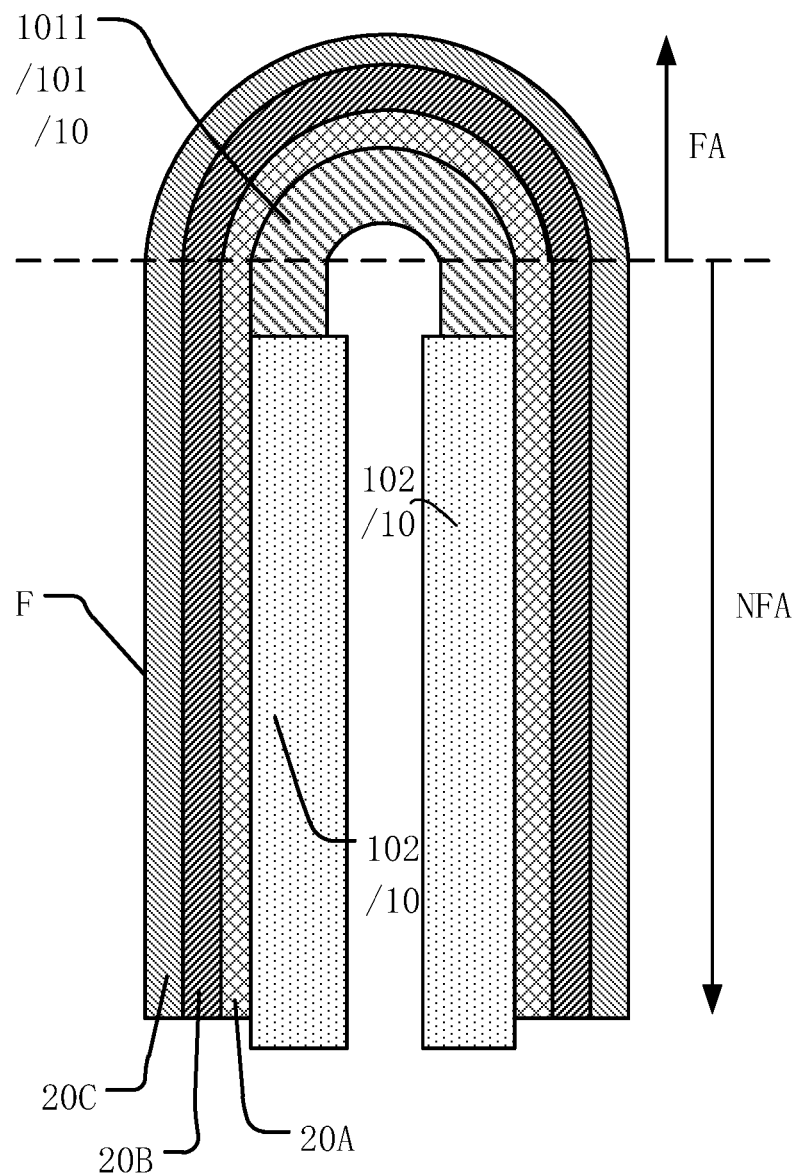
FIG. 7 illustrates a planar structural schematic of a foldable display module after being bent along a bendable region according to various embodiments of the present disclosure.
Figure 8:
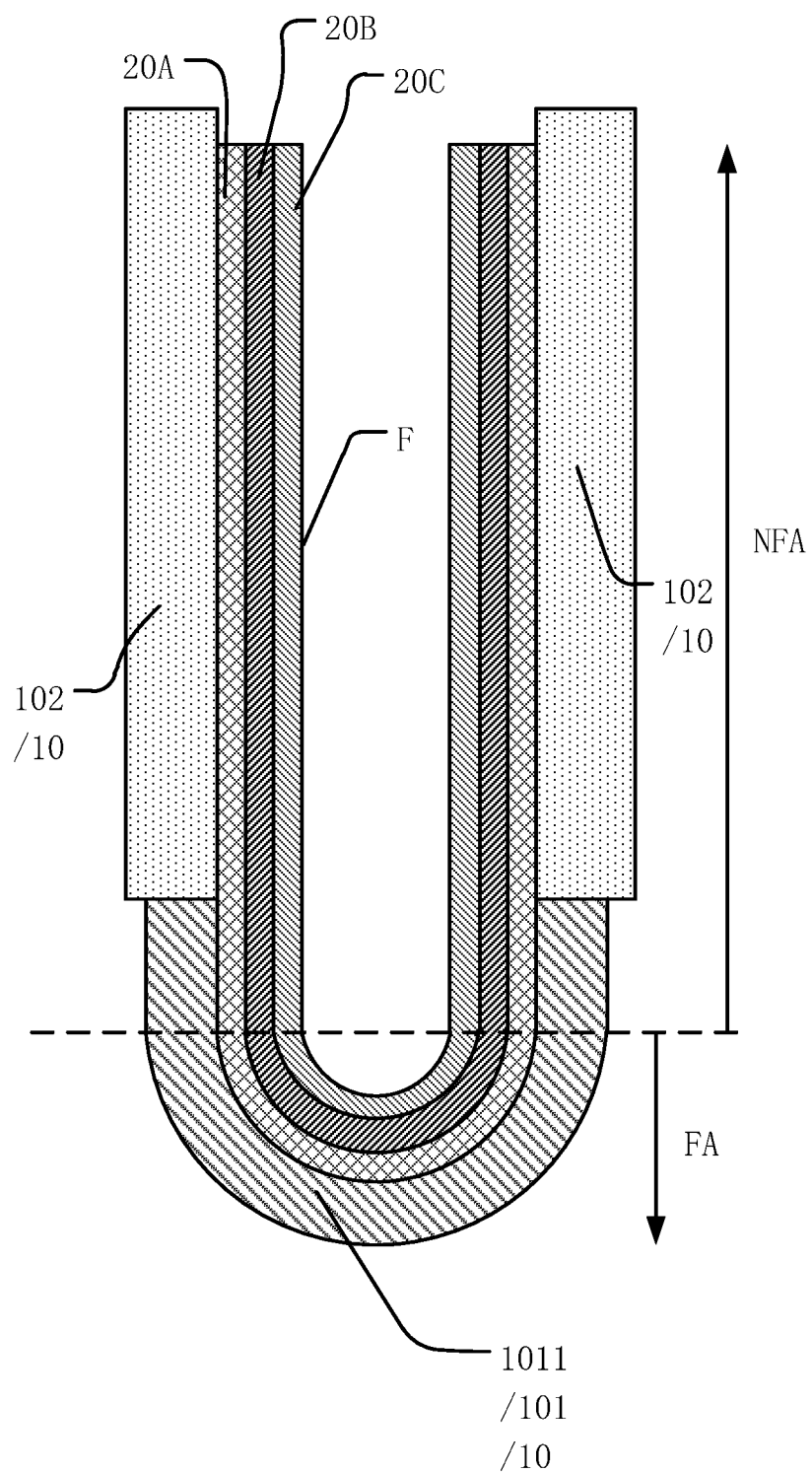
FIG. 8 illustrates another planar structural schematic of a foldable display module after being bent along a bendable region according to various embodiments of the present disclosure.

Optionally, the bending direction of the foldable display module 000 provided in one embodiment may include inward bending and outward bending. That is, after the foldable display module 000 is bent along the bendable region FA, the light-exiting surface F of the foldable display panel 20 may be located outside for users to view (outward bending as shown in FIG. 7, FIG. 7 illustrates a planar structural schematic of the foldable display module after being bent along the bendable region according to various embodiments of the present disclosure). The final viewable screen sizes may be different to meet the customer usage needs for the products of different sizes; the storage size of the product may be reduced, which is convenient for storage and carrying; and the device may be directly turned on to view relevant pictures of the foldable display panel 20, which may avoid frequent bending of the product. Or, after the foldable display module 000 is bent along the bendable region FA, the light-exiting surface F of the foldable display panel 20 may be located at an inner side (inward bending as shown in FIG. 8, FIG. 8 illustrates another planar structural schematic of the foldable display module after being bent along the bendable region according to various embodiments of the present disclosure). The storage size of the product may also be reduced, which is convenient for storage and carrying; and the foldable display panel 20 in the bent state may be protected, and the foldable display panel 20 may be unbent to implement a large-size display when needed to be viewed and used.

In some optional embodiments, referring to FIGS. 1-8, the density of the first material of the first support part 101 may be greater than the density of the second material of the second support part 102. Therefore, two materials with different densities may be configured to reduce the weight of the support plate 10 of the non-bendable region NFA, and the flatness of the non-bendable region NFA of the foldable display module 000 may be ensured as possible; and the first material with high density and heavy weight may be used to form the first support part 101 of the support plate 10 in the bendable region FA which is relatively fragile in the foldable display module 000, thereby ensuring relatively robust support performance and bending performance.

Optionally, in one embodiment, the elastic modulus of the first material of the first support part 101 may be less than the elastic modulus of the second material of the second support part 102, which is beneficial for ensuring the bending performance of the support plate 10 of the bendable region FA.

In one embodiment, the density of the first material of the first support part 101 may be greater than the density of the second material of the second support part 102, and the elastic modulus of the first material of the first support part 101 may be less than the elastic modulus of the second material of the second support part 102, which may not only reduce the weight of the entire module, but also ensure the support flatness and bending effect of the module.

Optionally, the first material of the first support part 101 may be a metal material, and the second material of the second support part 102 may be an organic material, such as a plastic material. The elastic modulus of the metal material is less than the elastic modulus of the plastic material, the density of the metal material such as stainless steel is about 7930 kg/m$^3$, and the density of the plastic material is about 1500 kg/m$^3$. Therefore, compared with the metal material under a same volume, the weight of the support plate made of the plastic material may be reduced by about 80%. For the support plate made of all-metal film layers, if a same weight standard is used, about 80% of the area (or weight) of the support plate may be reduced by the manners such as hollowing out or partial thinning. However, the support plate formed by such manner may no longer meet the supporting effect, and the supporting effect of the foldable display panel may be affected. Furthermore, in the foldable display module, as shown in FIG. 1 or FIG. 5 in one embodiment, the area of the bendable region FA may be less than the area of the non-bendable region NFA, that is, the area of the bendable portion 201 of the foldable display panel 20 may be less than the area of the non-bendable portion 202 of the foldable display panel 20. In one embodiment, the material of the support plate 10 of the non-bendable region NFA with a larger area may be made of a plastic material with a lower density, so that the weight of the support plate 10 may be greatly reduced, and the weight of the entire module may be further greatly reduced. In addition, the material of the support plate 10 of the bendable region FA may be a metal material, the elastic modulus of the metal material may be less than that of the plastic material, and the support plate 10 in the bendable region FA of the foldable display module 000 may be made of a metal material with a small elastic modulus, which is beneficial for ensuring the bending performance of the support plate 10 in the bendable region FA. Therefore, in one embodiment, the first material of the first support part 101 may be a metal material, and the second material of the second support part 102 may be a plastic material, which may greatly reduce the module weight while ensuring the bending performance of the module. In addition, the second support part 102 made of the plastic material, having desirable flatness, may have a desirable supporting effect for the foldable display panel 20 in the non-bendable region NFA.

The metal and alloy materials have the properties including magnetic property, signal shielding, and weak impact resistance. If entire support plate 10 is made of metal or alloy materials, it may affect the camera focus adjustment and the antenna signal transmission in actual use and also make the impact resistance of the pre-manufactured machine worse. However, in the support plate 10 in one embodiment, the metal material may be used as the first support part 101 of the support plate 10 only in the bendable region FA, or the bendable region FA and a portion of the non-bendable region NFA; and the plastic material may be used as the second support part 102 of the support plate 10 in the other regions. The use of metal materials is reduced, so that the metal shielding and magnetic property of the entire module may be weakened along the direction perpendicular to the plane where the foldable display panel 20 is located, which is beneficial for the signal transmission of pre-manufactured machines and the use of non-magnetic devices. Therefore, in one embodiment, the designed structure of the support plate 10 may not only ensure the requirement of the bending function, but also reduce the product weight and signal shielding to improve signal transmission capabilities.

In some optional embodiments, referring to FIGS. 1-8, the first material of the first support part 101 may include a metal material, and the second support part 102 may include Mylar sheets.

In one embodiment, it may describe that the first material of the first support part 101 of the support plate 10 may include a metal material, and the second support part 102 may include Mylar sheets. Mylar sheets are biaxially stretched thin films made by heating dimethyl terephthalate and ethylene glycol with related catalysts and performing transesterification and vacuum polycondensation. Mylar sheets have excellent tear strength, temperature resistance, weather resistance, moisture resistance, water resistance, chemical corrosion resistance, and has excellent electrical insulation property. Therefore, in one embodiment, the first material of the first support part 101 of the support plate 10 may include a metal material, and the second support part 102 may include Mylar sheets, which may not only ensure the requirement of the bending function, but also reduce the product weight and signal shielding to improve signal transmission capability, and further achieve desirable buffering effect and heat dissipation effect, thereby being beneficial for improving the display quality of the foldable display panel 20.

In some optional embodiments, referring to FIGS. 1-6, the first support part 101 may include a first support surface 101A facing toward the side of the foldable display panel 20; the second support part 102 may include a second support surface 102A facing toward the side of the foldable display panel 20; and the first support surface 101A may not overlap the second support surface 102A. Optionally, the first support surface 101A and the second support surface 102A may be located in a same plane.

Optionally, in one embodiment, the first support surface 101A of the first support part 101 facing toward the foldable display panel 20 and the second support surface 102A of the second support part 102 facing toward the foldable display panel 20, seamless splicing (e.g., connecting) structures, may jointly form the support surface of the support plate 10 for supporting the foldable display panel 20, thereby improving the firmness of the support plate 10 and maintaining the flatness of the support plate 10.

Optionally, in one embodiment, the first support part 101 and the second support part 102 of the support plate 10 may be a single piece structure, which is beneficial for being attached to the side of the foldable display panel 20 as a whole structure, thereby improving the process efficiency and the stability of the entire module.

Figure 9:
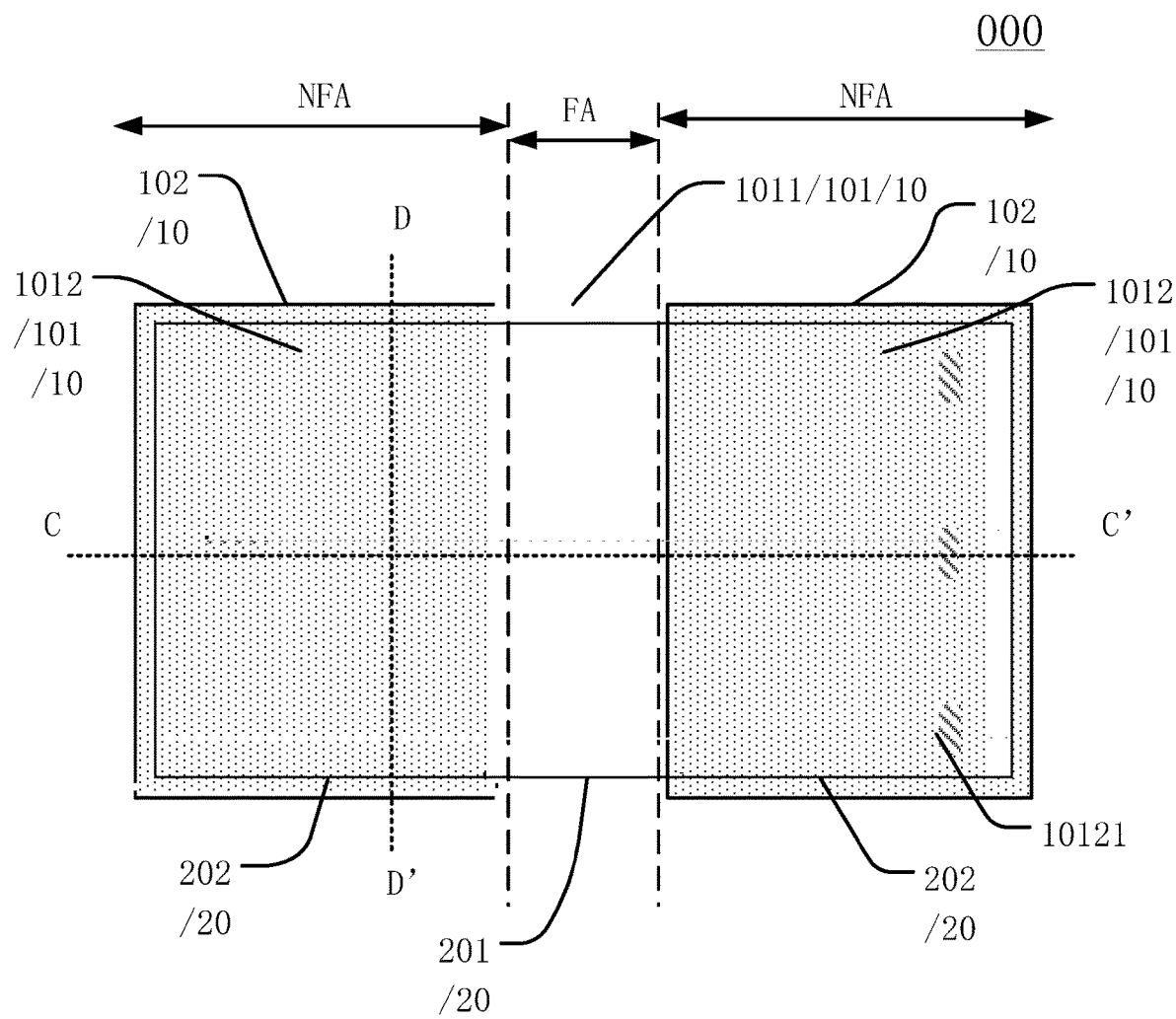
FIG. 9 illustrates a planar structural schematic of another foldable display module according to various embodiments of the present disclosure.
Figure 10:
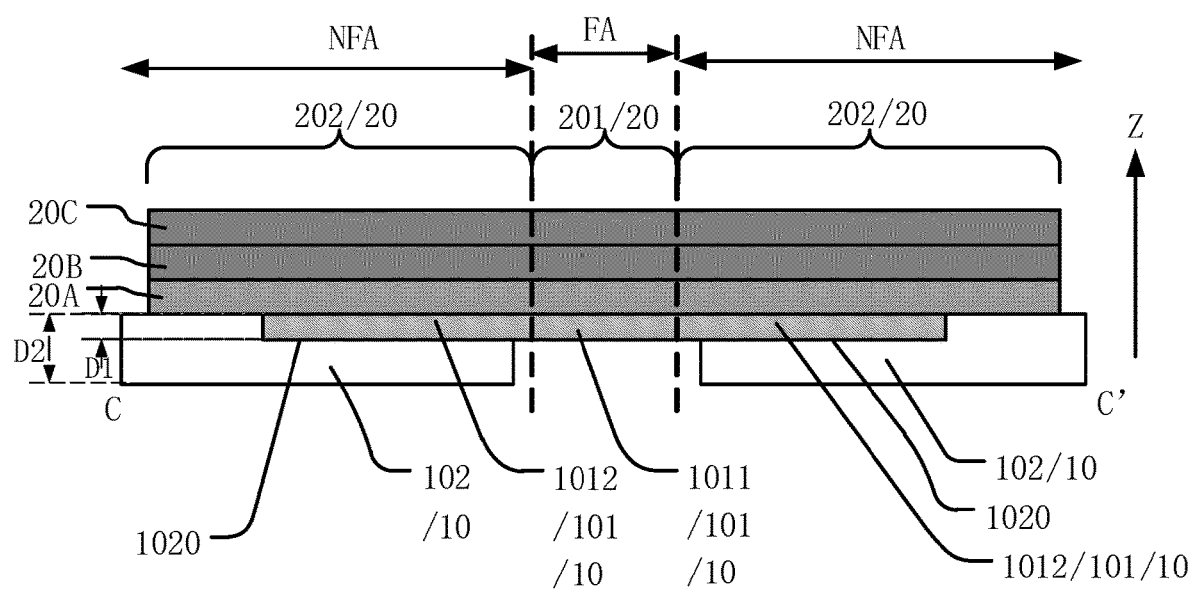
FIG. 10 illustrates a cross-sectional structural schematic along a C-C' direction in FIG. 9.

In some optional embodiments, referring to FIGS. 9-10, FIG. 9 illustrates a planar structural schematic of another foldable display module according to various embodiments of the present disclosure; and FIG. 10 illustrates a cross-sectional structural schematic along a C-C' direction in FIG. 9. In order to clearly illustrate the structure in one embodiment, the transparency filling may be performed on the foldable display panel in FIG. 9. In one embodiment, the first support part 101 may further include a second portion 1012; the second portion 1012 may be connected to the first portion 1011; and the second portion 1012 may include a portion located in the non-bendable region NFA.

An end of the second portion 1012 adjacent to the bendable region FA may be coplanar with an end of the second support part 102 adjacent to the bendable region FA.

Along a direction Z perpendicular to the plane where the foldable display panel 20 is located, the second portion 1012 of the first support part 101 may overlap the second support part 102. The second support part 102 may include portions with different thicknesses, and the thickness of the second support part 102 intersecting with the second portion 1012 of the first support part 101 may be relatively small.

In one embodiment, it may describe that the first support part 101 of the support plate 10 may include the first portion 1011 and the second portion 1012; the first portion 1011 may be used to support the bendable portion 201 of the foldable display panel 20; the second portion 1012 may be connected to the first portion 1011; and the second portion 1012 and the first portion 1011, which form a single piece structure, may be made of a same material in a same process. Optionally, along the direction Z perpendicular to the plane where the foldable display panel 20 is located, the second portion 1012 of the first support part 101 may at least partially overlap the second support part 102. Therefore, the contact area between the first support part 101 and the second support part 102 may be increased through the second portion 1012 connected to the first portion 1011 of the first support part 101; and the fixed connection effect between the first support part 101 and the second support part 102 may be achieved through the fitting the extended second portion 1012 with the second support part 102, thereby improving the stability and reliability of the entire support plate 10.

Optionally, the thicknesses of the first support part 101 and the second support part 102 along the direction Z perpendicular to the plane where the foldable display panel 20 is located may also be same. That is, the first support part 101 and the second support part 102 may be arranged along the direction in parallel with the plane where the foldable display panel 20 is located. As shown in FIG. 9, the second support part 102 and the second portion of the first support part 101 may be fitted with each other. As a result, the first support part 101 and the second support part 102 made of different materials may jointly form the flat support plate 10, thereby ensuring the support performance of the foldable display panel 20.

Figure 11:
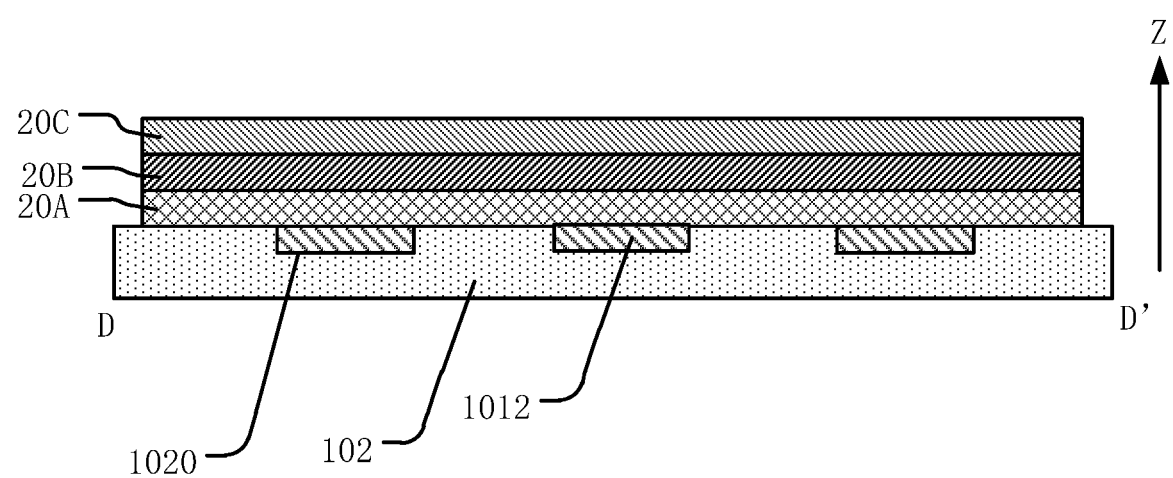
FIG. 11 illustrates a cross-sectional structural schematic along a D-D' direction in FIG. 9.

Referring to FIGS. 9-11, FIG. 11 illustrates a cross-sectional structural schematic along a D-D' direction in FIG. 9. The second support part 102 may be fitted with the second portion 1012 of the first support part 101. Optionally, a groove 1020 may be formed on the side of the second support part 102 facing toward the foldable display panel 20, and the second portion 1012 of the first support part 101 may be located in the groove 1020. The second portion 1012 of the first support part 101 may be in contact with the sidewalls of the groove 1020 formed on the second support part 102 and with the bottom of the groove 1020. In such way, the second portion 1012 of the first support part 101 may be filled into the groove 1020 to form a fixing structure in which the second support part 102 is fitted with the second portion 1012 of the first support part 101. Therefore, the support surface of the support plate 10 adjacent to the foldable display panel 20 may be maintained at a same plane, which is beneficial for ensuring the support performance while also ensuring the attaching flatness between the support plate 10 and the foldable display panel 20.

In the implementation manner involving the second support part 102 having the groove 1020, the thickness of the second support part 102 may be greater than the thickness of the first support part 101. The thickness of the second support part 102 may be understood as the thickness of the region of the second support part 102 where the groove 1020 is not formed.

Figure 12:
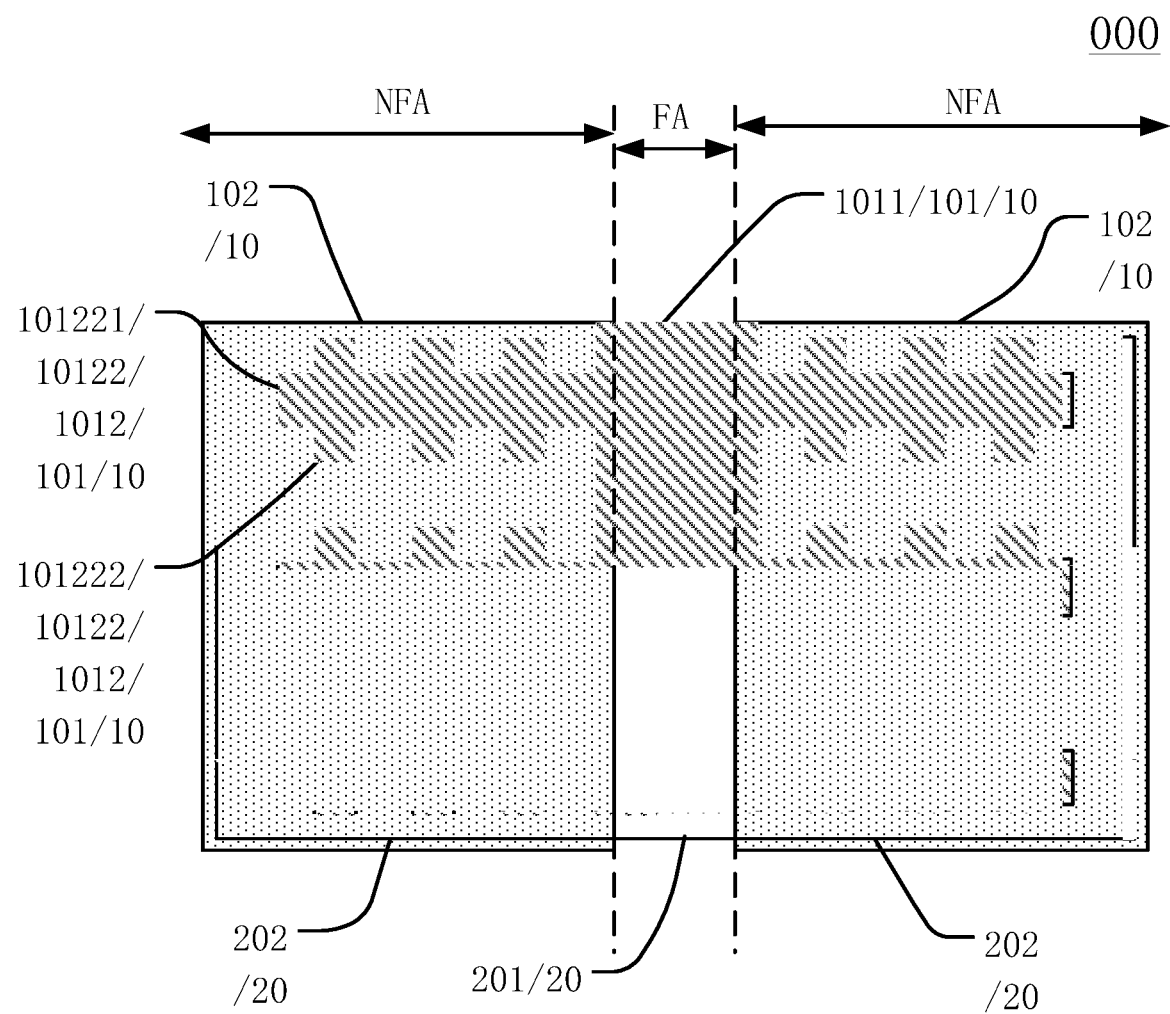
FIG. 12 illustrates a planar structural schematic of another foldable display module according to various embodiments of the present disclosure.
Figure 13:
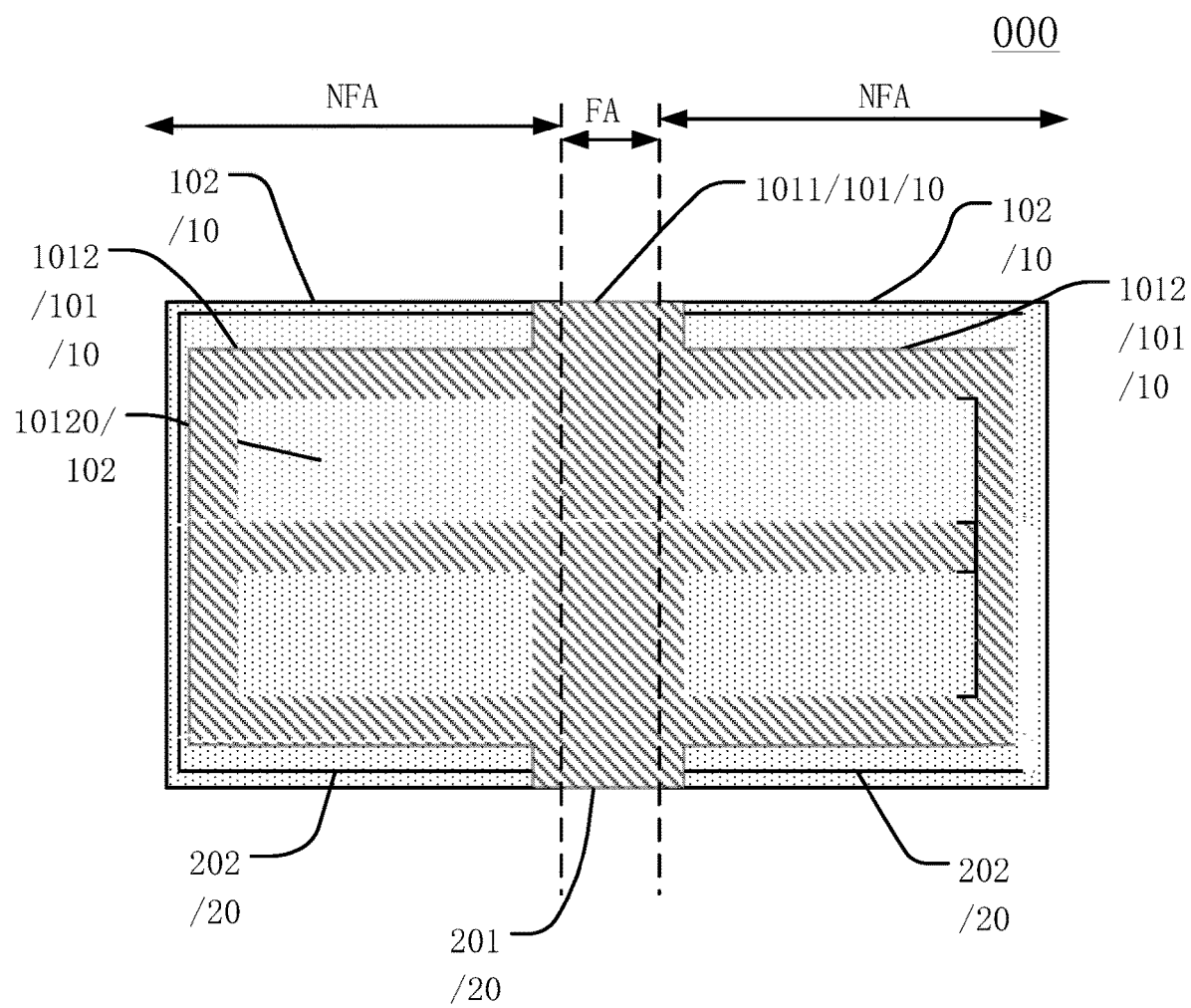
FIG. 13 illustrates a planar structural schematic of another foldable display module according to various embodiments of the present disclosure.
Figure 14:
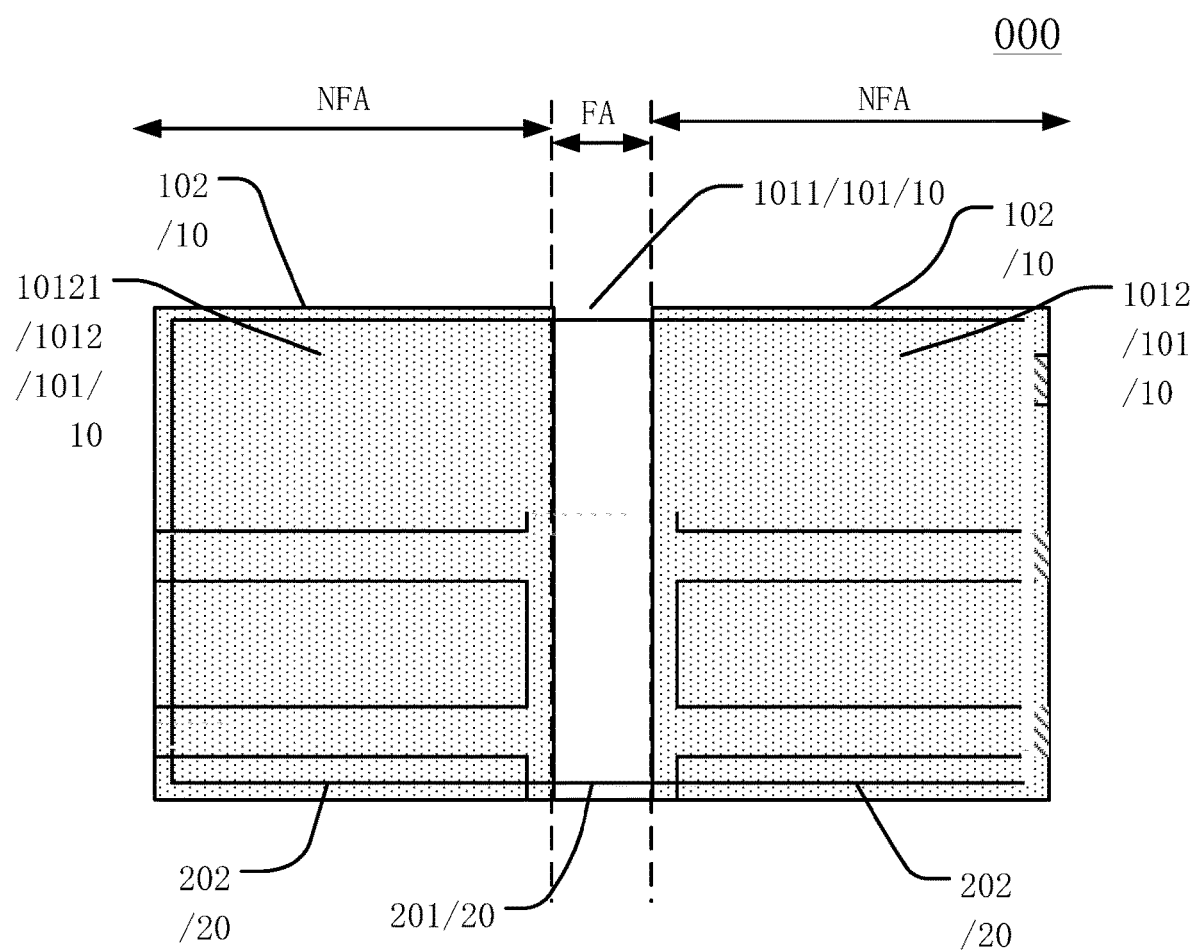
FIG. 14 illustrates a planar structural schematic of another foldable display module according to various embodiments of the present disclosure.

In some optional embodiments, referring to FIGS. 9, 12, 13 and 14, FIG. 12 illustrates a planar structural schematic of another foldable display module according to various embodiments of the present disclosure; FIG. 13 illustrates a planar structural schematic of another foldable display module according to various embodiments of the present disclosure; and FIG. 14 illustrates a planar structural schematic of another foldable display module according to various embodiments of the present disclosure. In order to clearly illustrate the structure in one embodiment, the transparency filling may be performed on the foldable display panel in FIGS. 12-14. Different implementation manners of the second portion 1012 of the first support part 101 are illustrated in FIGS. 12-14.

The second portion 1012 of the first support part 101 connected to the first portion 1011 may include a plurality of first sub-portions 10121 which are discretely disposed in the non-bendable region NFA; the first sub-portion 10121 may be strip-shaped; and the strip-shaped first sub-portion 10121 may extend along the arrangement direction of the bendable region FA and the non-bendable region NFA (as shown in FIG. 9).

Or, the second portion 1012 may include a plurality of second sub-portions 10122 which are discretely disposed in the non-bendable region NFA; the second sub-portion 10122 may include a main portion 101221 and a plurality of branches 101222 connected to the main portion 101221; and the main portion 101221 may be strip-shaped and extend along the arrangement direction of the bendable region FA and the non-bendable region NFA (as shown in FIG. 12).

Or, the second portion 1012 may be mesh-shaped, and the position of the mesh-shaped grid 10120 may expose the second support part 102 (as shown in FIG. 13).

In one embodiment, it may describe that the disposed structure of the second portion 1012 in the first support part 101 connected to the first portion 1011 may be that the second portion 1012 as shown in FIG. 9 may include a plurality of first sub-portions 10121 discretely disposed, the first sub-portion 10121 may be located in the non-bendable region NF, the first sub-portion 10121 may be strip-shaped, and the strip-shaped first sub-portion 10121 may extend along the arrangement direction of the bendable region FA and the non-bendable region NFA. The disposed structure of the second portion 1012 may also be that the second portion 1012 as shown in FIG. 12 may include a plurality of second sub-portions 10122 discretely disposed, the second sub-portion 10122 may be located in the non-bendable region NFA, the second sub-portion 10122 may include the main portion 101221 and a plurality of branches 101222 connected to the main portion 101221, and the main portion 101221 may be strip-shaped and extend along the arrangement direction of the bendable region FA and the non-bendable region NFA. The disposed structure of the second portion 1012 may also be that the second portion 1012 may be mesh-shaped, and the position of the mesh-shaped grid 10120 may expose the second support part 102. The structure of the second portion 1012 may not be limited to the above-mentioned structures, and may also include other suitable structures. In one embodiment, for the arrangement manner of the second portion 1012 connected to the first portion 1011 in the first support part 101, the usage area of the first material of the first support part 101 may not only be reduced by the structure shape of the second portion 1012 including the plurality of sub-portions, thereby reducing the weight of the module; the combination of the first support part 101 and the second support part 102 may also be more secure; and through the extension direction of the plurality of sub-portions same as the arrangement direction of the bendable region FA and the non-bendable region NFA, the heat for the first support part 101 may be better dissipated to realize heat conduction, which may prevent the heat generated when the foldable display module 000 is in use from affecting the entire support plate 10.

It should be understood that, in one embodiment, the second portion 1012 of the first support part 101 may be a structure including a plurality of sub-portions discretely disposed or a mesh-shaped structure. Optionally, the second portion 1012 of the first support part 101 may still be a single piece structure. That is, the second portion 1012 may not be divided into discrete structures by the plurality of sub-portions discretely disposed and may still be a single piece structure. In such way, the second portion 1012 may have a desirable supporting effect on the foldable display panel 20 in the non-bendable region NFA.

Optionally, referring to FIG. 14, the second portion 1012 of the first support part 101 connected to the first portion 1011 may include a plurality of first sub-portions 10121 discretely disposed; the first sub-portions 10121 may be located in the non-bendable region NFA; the first sub-portions 10121 may be strip-shaped; the extension direction of the strip-shaped first sub-portions 10121 may extend along the arrangement direction of the bendable region FA and the non-bendable region NFA; and the strip-shaped first sub-portion 10121 may extend to the edge position of the non-bendable region NFA on the side away from the bendable region FA. Therefore, the strip-shaped first sub-portions 10121 may extend toward the edge of the non-bendable region NFA on the side away from the bendable region FA as possible, which may be beneficial for achieving a desirable heat dissipation effect through the strip-shaped first sub-portions 10121.

Optionally, as shown in FIG. 9 and FIGS. 12-14, the second support part 102 in one embodiment may be a single piece structure. The second portion 1012 of the first support part 101 is a structure including a plurality of sub-portions discretely disposed or a mesh-shaped structure. However, the second support part 102 may not be divided into discrete structures by the above-mentioned mesh-shaped structure or the second portion 1012 of the first support part 101 discretely disposed with the plurality of sub-portions. That is, the second support part 102 may still be a single piece structure, such that the second support part 102 may have a desirable supporting effect on the foldable display panel 20 in the non-bendable region NFA.

It should be understood that the number of sub-portions included in the second portion 1012 in the drawings of one embodiment may be only three for illustration, and may not indicate the actual number. During actual implementation, the number of sub-portions or the number of grids included in the second portion 1012 may be configured according to actual requirements. The widths of the sub-portions included in the second portion 1012 in the drawings of one embodiment may be merely exemplary, and may not indicate the actual widths; and the widths of all sub-portions may be different or same. During actual implementation, the widths of the sub-portions included in the second portion 1012 may be configured according to actual requirements.

Figure 15:
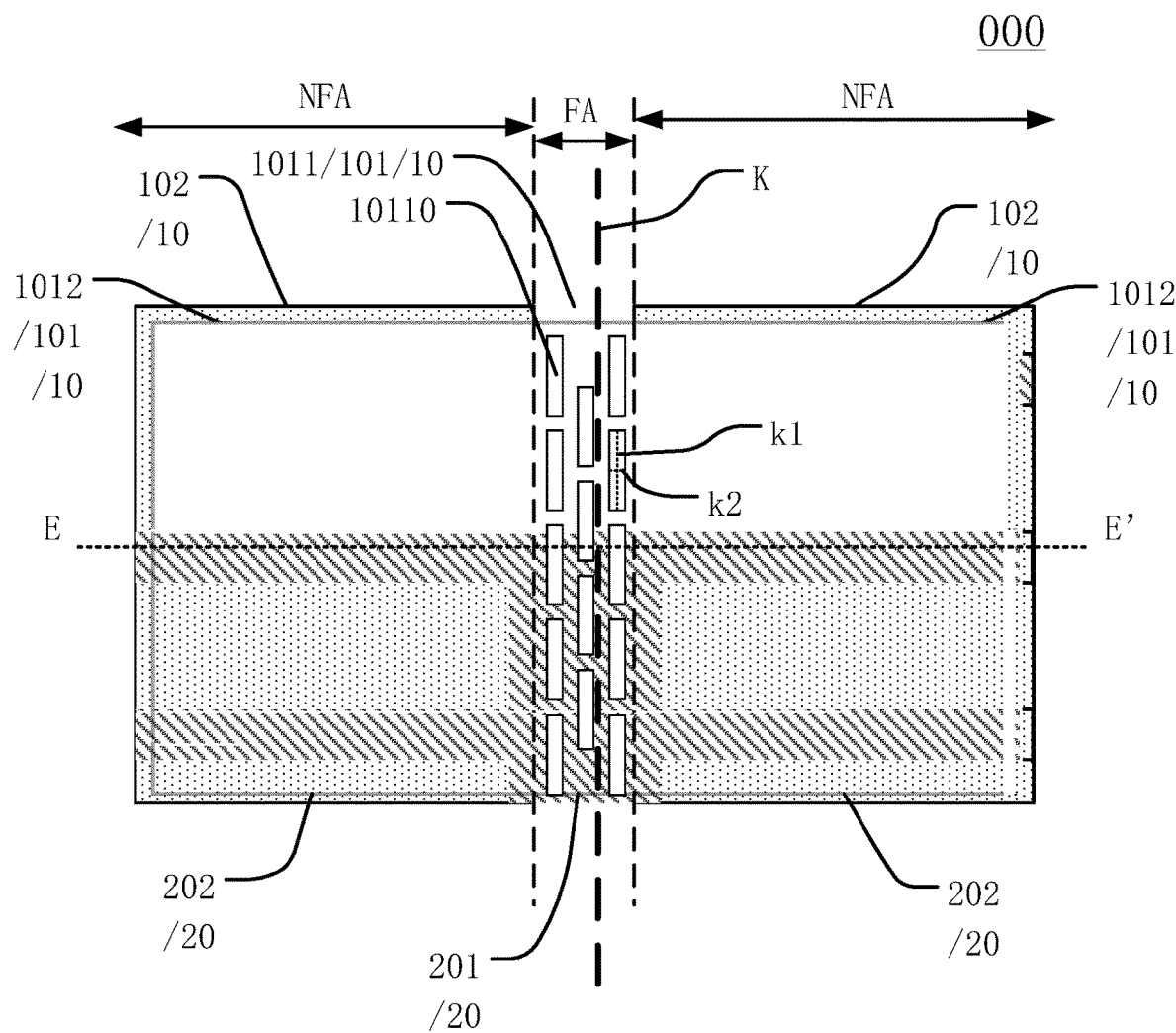
FIG. 15 illustrates a planar structural schematic of another foldable display module according to various embodiments of the present disclosure.
Figure 16:
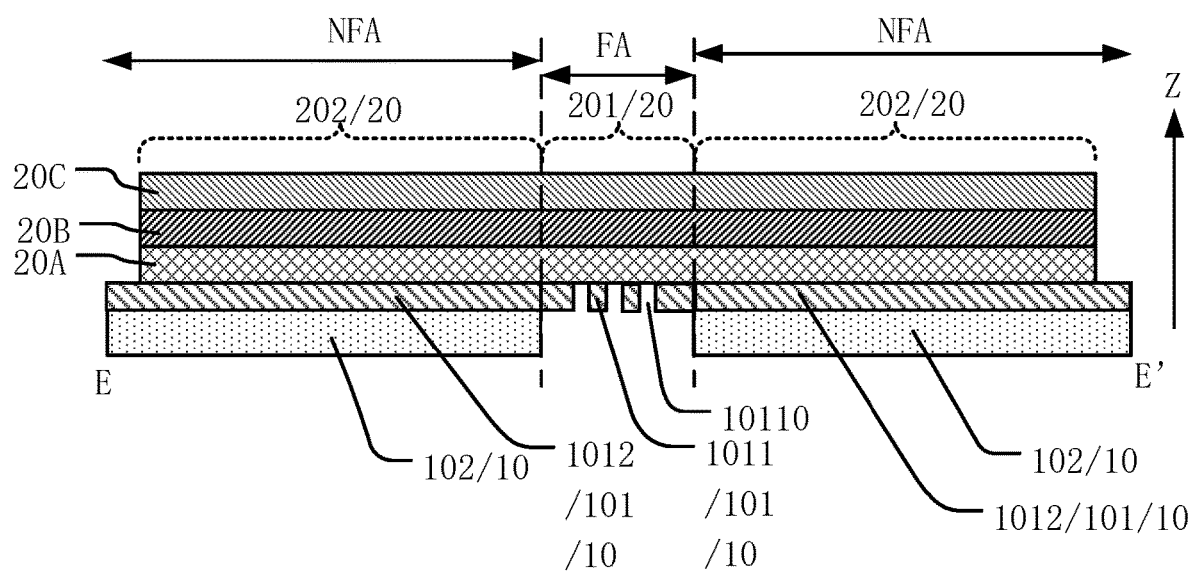
FIG. 16 illustrates a cross-sectional structural schematic along an E-E' direction in FIG. 15.

In some optional embodiments, referring to FIGS. 15-16, FIG. 15 illustrates a planar structural schematic of another foldable display module according to various embodiments of the present disclosure; and FIG. 16 illustrates a cross-sectional structural schematic along an E-E' direction in FIG. 15. In order to clearly illustrate the structure in one embodiment, the transparency filling may be performed on the foldable display panel in FIG. 15. In one embodiment, the first portion 1011 of the first support part 101 of the support plate 10 may be disposed with a plurality of hollowed structures 10110.

In one embodiment, it may describe that the first portion 1011 of the first support part 101 of the support plate 10 may be disposed with a plurality of hollowed structures 10110. Optionally, along the direction Z perpendicular to the plane where the foldable display panel 20 is located, the hollowed structures 10110 may pass through the first portion 1011. In one embodiment, the plurality of hollowed structures 10110 may be disposed on the first portion 1011 of the first support part 101 made of the first material, which may not only further reduce the weight of the module, but also reduce the elastic modulus value of the first support part 101, thereby being convenient for realizing the bending of the first portion 1011 in the bendable region FA.

Figure 17:
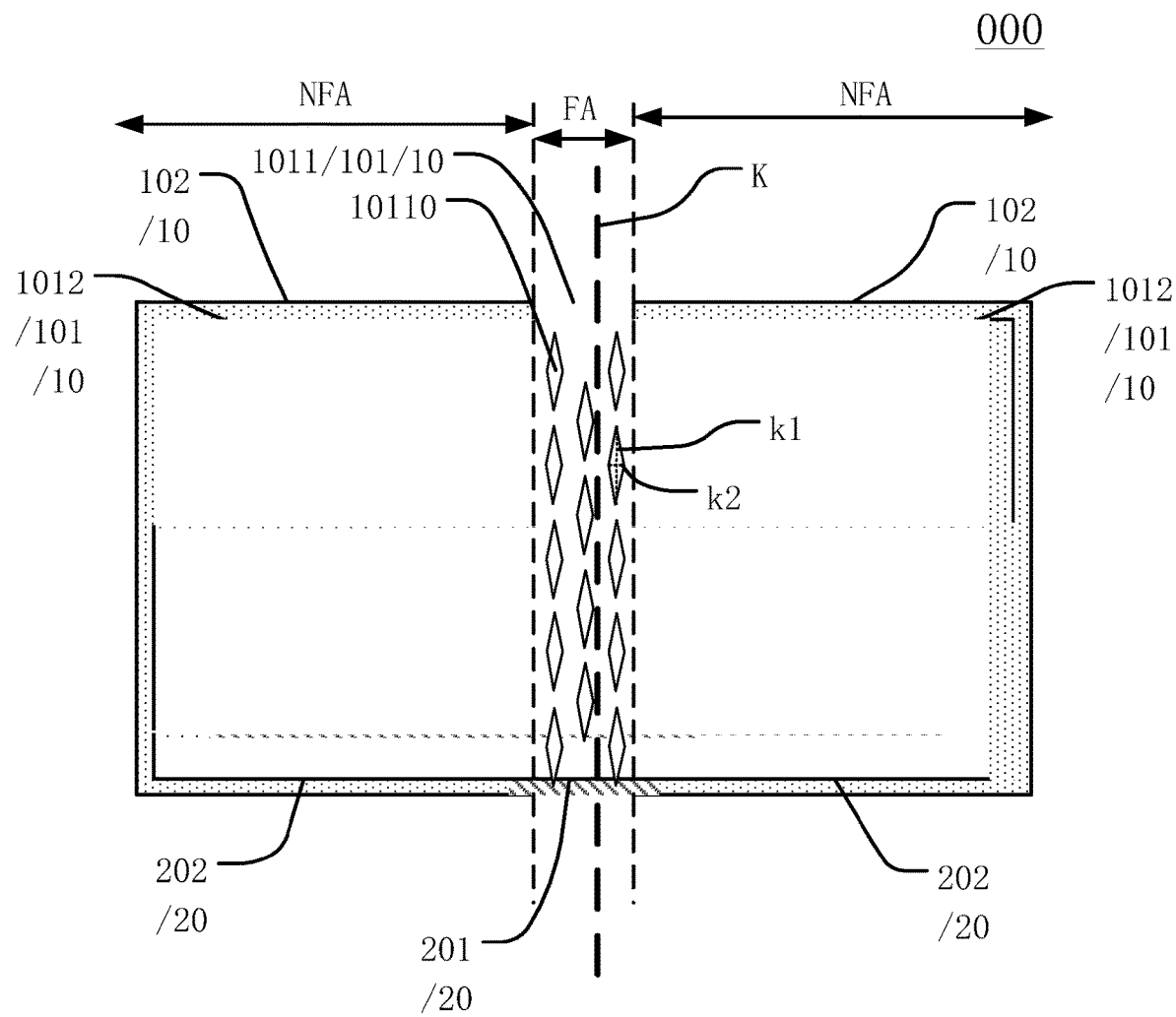
FIG. 17 illustrates a planar structural schematic of another foldable display module according to various embodiments of the present disclosure.
Figure 18:
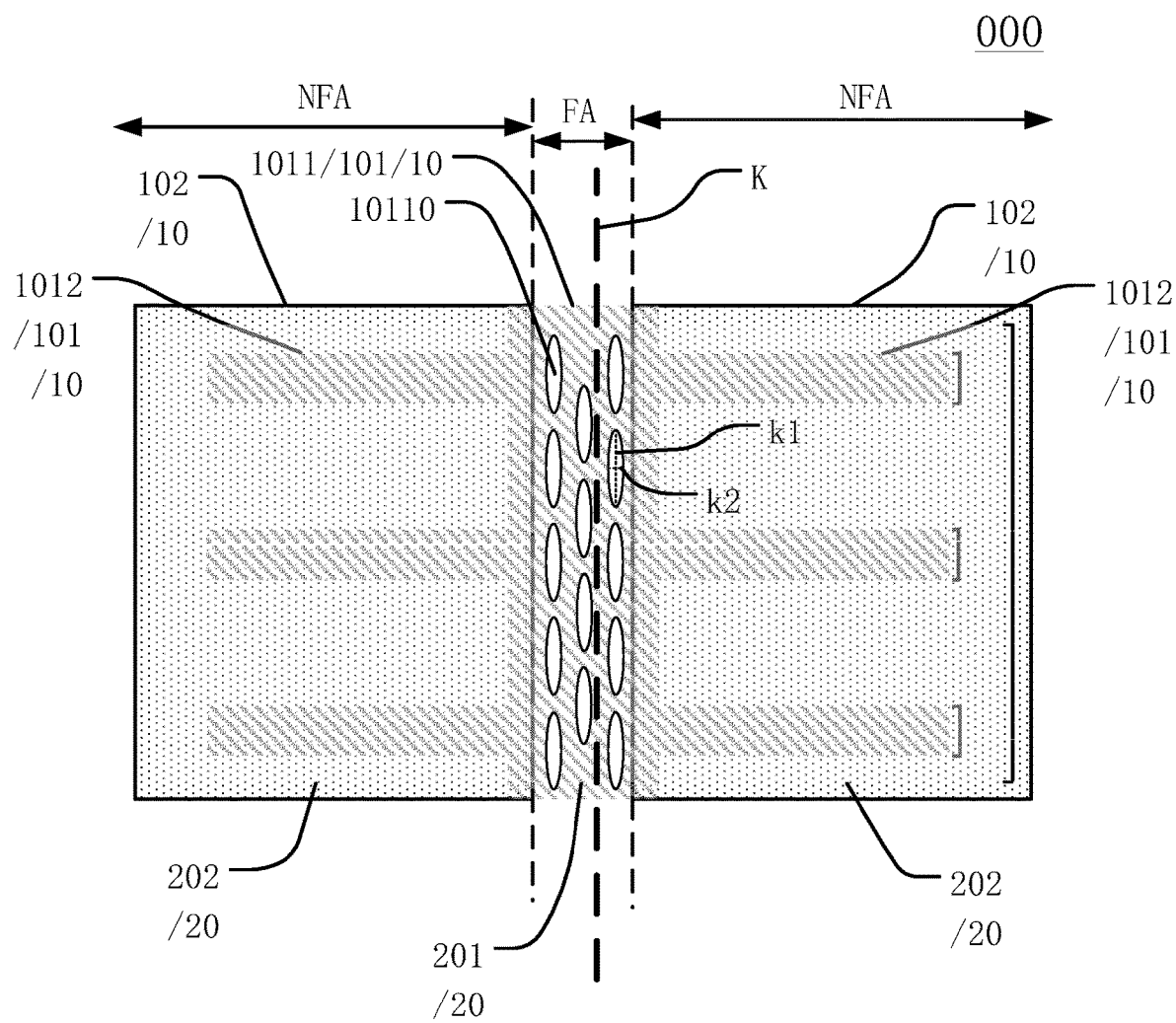
FIG. 18 illustrates a planar structural schematic of another foldable display module according to various embodiments of the present disclosure.

Optionally, referring to FIGS. 15, 17 and 18, FIG. 17 illustrates a planar structural schematic of another foldable display module according to various embodiments of the present disclosure; and FIG. 18 illustrates a planar structural schematic of another foldable display module according to various embodiments of the present disclosure. In order to clearly illustrate the structure in one embodiment, the transparency filling may be performed on the foldable display panel in FIGS. 17-18. The shape of the orthographic projection of the hollowed structure 10110 onto the plane where the foldable display panel 20 is located may include any one of a long strip (as shown in FIG. 15), a rhombus (as shown in FIG. 17), and an ellipse (as shown in FIG. 18) or other suitable shapes. It may only need to satisfy that the shape of the orthographic projection of the hollowed structure 10110 onto the plane where the foldable display panel 20 is located may include at least two symmetry axes; the two symmetry axes may include a first axis k1 and a second axis k2; the extension direction of the first axis k1 may be same as the direction of the bending axis K of the foldable display module 000; the extension direction of the second axis k2 may intersect or be perpendicular to the extension direction of the first axis k1; and the length of the hollowed structure 10110 on the first axis k1 may be greater than the length of the hollowed structure 10110 on the second axis k2. It should be understood that the bending axis K may be a virtual structure, which indicates that the bending axis K of the foldable display module 000 may be within the range of the bendable region FA, and the structure where two non-bendable regions NFA of the foldable display module 000 are opposite to each other may be formed by bending along the bending axis K. Therefore, the extension direction of the longer region of the hollowed structure 10110 may be same as the direction of the bending axis K of the foldable display module 000. The hollowed structures 10110 may be used to guide the foldable display module 000 to be bent within the range of the bendable region FA as possible.

Optionally, the arrangement manner of the plurality of hollowed structures 10110 within the range of the first portion 1011 may be as shown in FIG. 15, and FIGS. 17-18. Along the extension direction of the second axis k2, any two adjacent hollowed structures 10110 may be disposed staggered up and down, such that the fracture of the first portion

1011 caused by the aggregated hollowed structures 10110 may be avoided to affect the supporting effect of the support plate 10.

In some optional embodiments, refer to FIGS. 9 and 10, a thickness D2 of the second support part 102 of the support plate 10 may be greater than a thickness D1 of the first support part 101. It should be understood that, in one embodiment, the thickness D2 of the second support part 102 may refer to the thickness of the second support part 102 which is not overlapped with the first portion 1011 and the second portion 1012 of the first support part 101 (as shown in FIG. 10).

In one embodiment, it may describe that the thickness D2 of the second support part 102 of the support plate 10 may be greater than the thickness D1 of the first support part 101, such that the groove 1020 may be formed on the side of the second support part 102 facing toward the foldable display panel 20, thereby realizing the fitting and fixing of the first support part 101 and the second support part 102, which may ensure the stable effect of the support plate 10 and enable the support surface of the support plate 10 facing toward the foldable display panel 20 to be on a same plane to achieve a desirable supporting effect.

In some optional e embodiments, referring to FIGS. 9 and 10, the thickness D1 of the first support part 101 may be in the range of (100-300) μm, and the thickness D2 of the second support part 102 may be in the range of (100-1000) μm.

In one embodiment, it may describe that the thickness D2 of the second support part 102 of the support plate 10 may be greater than the thickness D1 of the first support part 101; and the thickness D1 of the first support part 101 may be in the range of (100, 300) μm, that is, $100 \ \mu m \leq D1 \leq 300 \ \mu m$; and the thickness D2 of the second support part 102 may be in the range of (100-1000) μm, that is, $100 \ \mu m \leq D1 \leq 1000 \ \mu m$. Therefore, while the thickness D2 of the second support part 102 is greater than the thickness D1 of the first support part 101, it may avoid the thickness D1 of the first support part 101 to be excessively large to affect the bendability of the bendable region FA and also avoid the thickness D1 of the first support part 101 to be excessively small to affect the supporting effect of the first support part 101 on the foldable display panel 20. Furthermore, the configuration range of the thickness D2 of the second support part 102 may ensure that the groove 1020, formed on the side of the second support part 102 facing toward the foldable display panel 20, may make the first support part 101 be fitted and fixed with the second support part 102; and may also make the second support part 102 of the second material have desirable support performance.

It should be understood that the same thickness of the first support part 101 may be taken as an example for illustration in the drawings of one embodiment. Optionally, the thickness of the first support part 101 in one embodiment may also be different, that is, the first support part 101 may include portions with different thicknesses. For example, the thickness of the second portion 1012 of the first support part 101 may be greater than the thickness of the first portion 1011. In such way, the second portion 1012 of the first support part 101 may be better fitted into the groove 1020 on the side of the second support part 102 facing toward the foldable display panel 20 to enhance the fitting effect. The second portion 1012 of the first support part 101 in one embodiment may only include the portion of the long-striped sub-portions located in the non-bendable region NFA. Or, as shown in FIG. 9, the second portion 1012 of the first support part 101 may not only include the portion of the long-striped sub-portions located in the non-bendable region NFA, but also include the portion which is located outside the range of the bendable region FA and in the non-bendable region NFA, and is used to connect a plurality of long-striped sub-portions with each other.

In some optional embodiments, referring to FIGS. 1-18, in the foldable display module 000 provided in one embodiment, the second support part 102 may be doped with metal particles (not shown in FIGS. 1-18).

In one embodiment, it may describe that the second support part 102 made of the second material may be doped with metal particles to increase the heat dissipation effect of the second support part 102 of the support plate 10. Optionally, the metal particles may be metal powders and sheets such as aluminum, copper, tin, silver, iron and the like which have desirable thermal conductivity. It may be understood that the particle sizes and ratios of the metal particles doped in the second support part 102 may not be limited according to various embodiments of the present disclosure. During actual implementation, the metal particles may be selected and configured according to actual needs, as long as it does not affect the support performance of the second support part 102 and does not increase the module weight as possible. Therefore, while realizing that the second support part 102 has heat dissipation effect, the module weight may be reduced as possible to improve the supporting effect and bending performance of the module.

Figure 19:
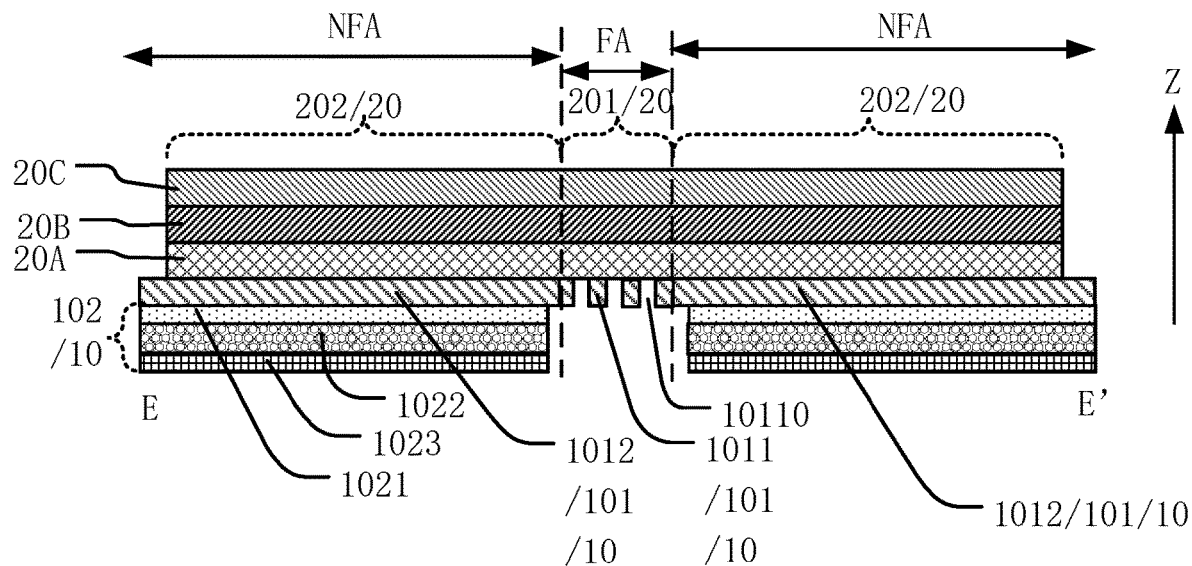
FIG. 19 illustrates another cross-sectional structural schematic along an E-E' direction in FIG. 15.

In some optional embodiments, referring to FIGS. 15 and 19, FIG. 19 illustrates another cross-sectional structural schematic along an E-E' direction in FIG. 15. In one embodiment, the second support part 102 may include a first sub-layer 1021, a second sub-layer 1022, and a third sub-layer 1023 that are stacked with each other. The second sub-layer 1022 may be located between the first sub-layer 1021 and the third sub-layer 1023; the first sub-layer 1021 and the third sub-layer 1023 may be flat and solid structures; and the second sub-layer 1022 may be a honeycomb hollowed structure.

In one embodiment, it may describe that the second support part 102 made of the second material may include the first sub-layer 1021, the second sub-layer 1022 and the third sub-layer 1023 that are stacked with each other. Optionally, in one embodiment, along the direction Z perpendicular to the plane where the foldable display panel 20 is located, the first sub-layer 1021 may be located on the side of the third sub-layer 1023 adjacent to the foldable display panel 20 as an example for illustration. The second sub-layer 1022 located between the first sub-layer 1021 and the third sub-layer 1023 may be a honeycomb hollowed structure, which may increase the elasticity of the second support part 102, thereby being beneficial for further improving the impact resistance of the support plate 10. Furthermore, the first sub-layer 1021 and the third sub-layer 1023 may be flat and solid structures, which may ensure that the side of the second support part 102 facing toward the foldable display panel 20 is a flat surface, thereby being beneficial for improving the attaching flatness and the supporting effect.

It should be understood that the thicknesses of the first sublayer 1021, the second sublayer 1022, and the third sublayer 1023 may not be limited according to various embodiments of the present disclosure. During actual implementation, the thickness of each sub-layer may be selected and configured according to actual requirements, as long as the second sub-layer 1022 may be disposed with a honeycomb hollowed structure while ensuring the supporting effect.

Figure 20:
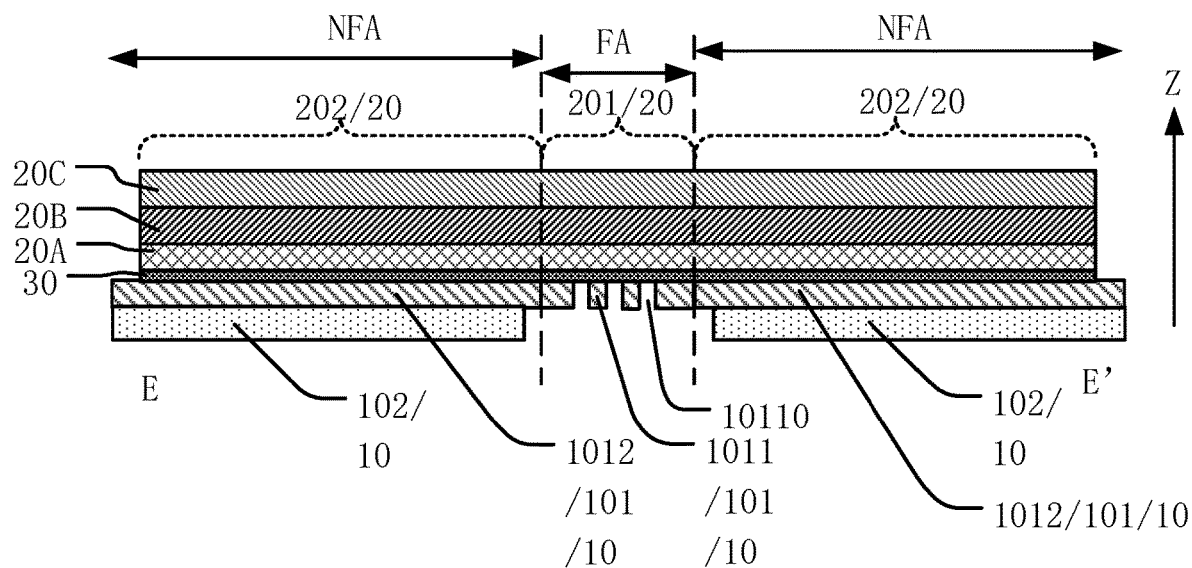
FIG. 20 illustrates another cross-sectional structural schematic along an E-E' direction in FIG. 15.

In some optional embodiments, referring to FIGS. 15 and 20, FIG. 20 illustrates another cross-sectional structural schematic along an E-E' direction in FIG. 15. In one embodiment, the support plate 10 and the foldable display panel 20 may be attached and affixed by an optical adhesive layer 30.

In one embodiment, it may describe that the support plate 10 and the foldable display panel 20 may be attached and affixed by an optical adhesive layer 30; and the optical adhesive layer 30 may be OCA (optically clear adhesive). The features such as low modulus, high elasticity, stress resistance and the like of the optical adhesive layer 30 may be used to effectively reduce the stress transmission of the support plate 10 when the foldable display module 000 is bent, thereby protecting the display function layer in the foldable display panel 20.

Figure 21:
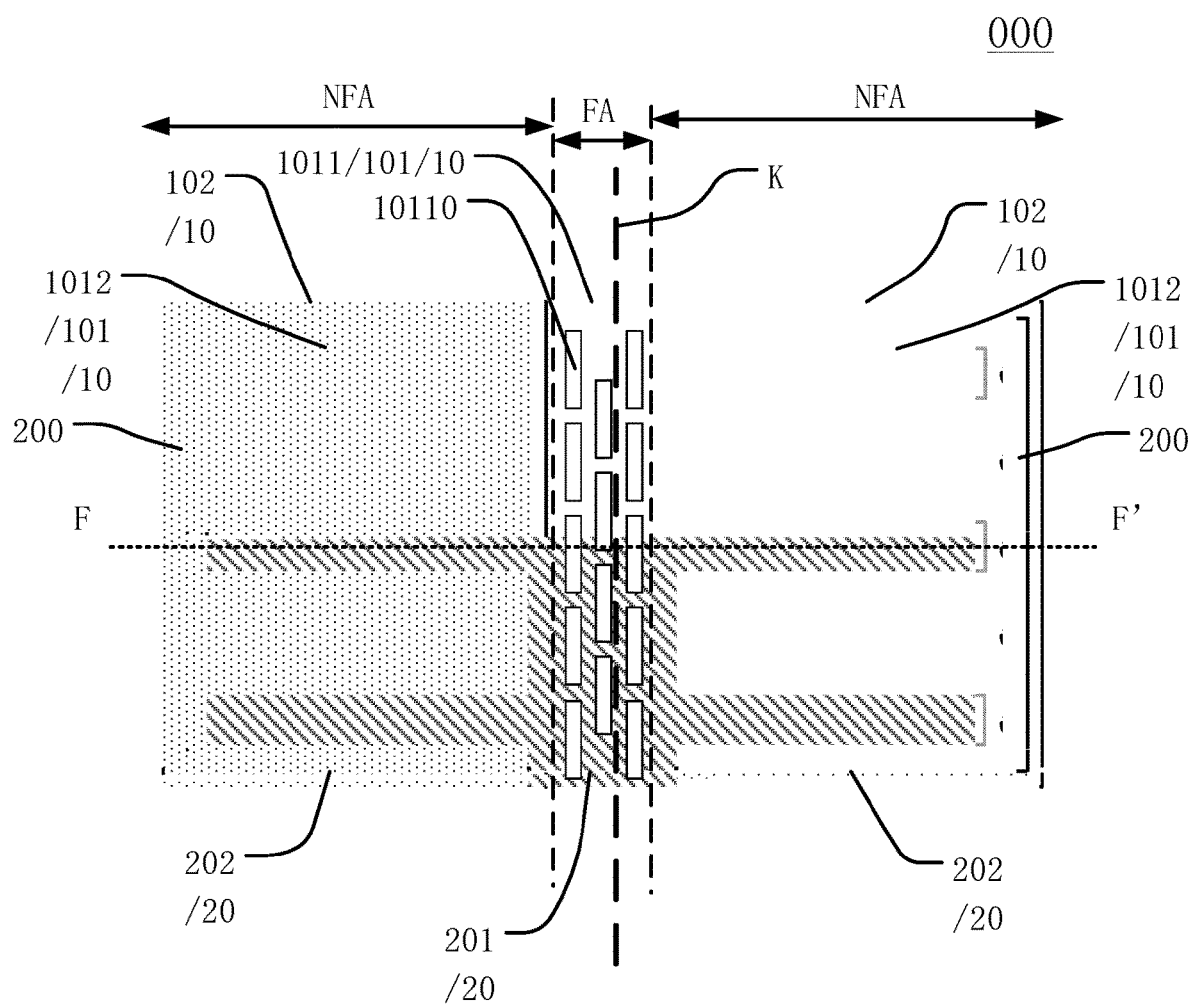
FIG. 21 illustrates a planar structural schematic of another foldable display module according to various embodiments of the present disclosure.
Figure 22:
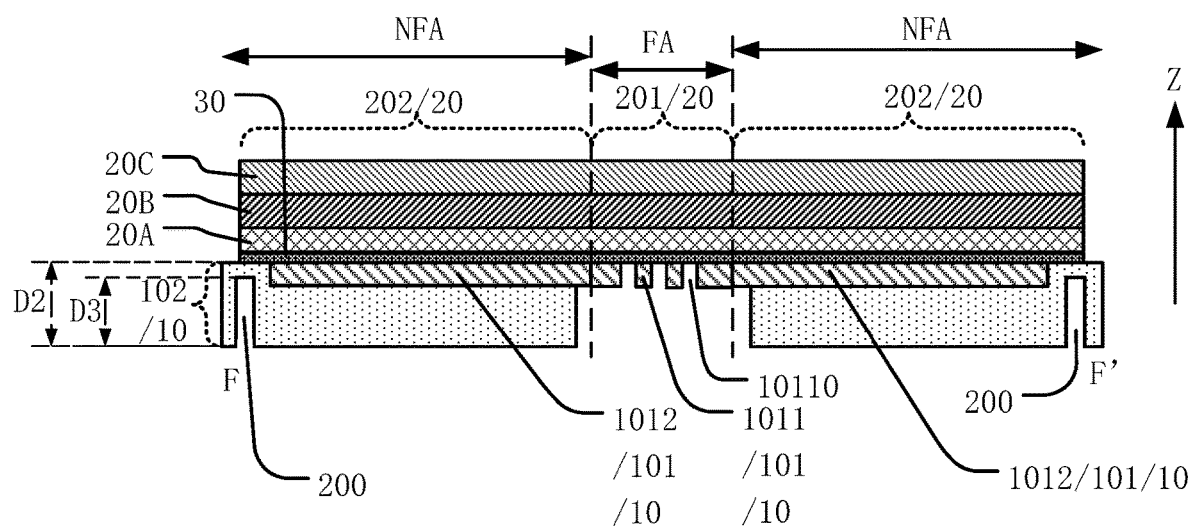
FIG. 22 illustrates a cross-sectional structural schematic along an F-F' direction in FIG. 21.

In some optional embodiments, referring to FIGS. 21-22, FIG. 21 illustrates a planar structural schematic of another foldable display module according to various embodiments of the present disclosure; and FIG. 22 illustrates a cross-sectional structural schematic along an F-F' direction in FIG. 21. In order to clearly illustrate the structure in one embodiment, the transparency filling may be performed on the foldable display panel and the support plate in FIG. 21. In one embodiment, a plurality of screw holes 200 may be disposed on the side of the second support part 102 away from the foldable display panel 20. Optionally, along the direction parallel to the plane where the foldable display panel 20 is located, on the side of the second support part 102 away from the bendable region FA, the plurality of screw holes 200 may be arranged sequentially along the extension direction of the bending axis K.

In one embodiment, it may describe that the plurality of screw holes 200 may be disposed on the side of the second support part 102 away from the foldable display panel 20. Optionally, the disposed screw holes 200 may be at the edge position of the second support part 102 on the side far away from the bendable region FA. The second support part 102 made of the second material may not only be used to support the foldable display panel 20 in the non-bendable region NFA, but also be used as the middle frame of the pre-manufactured machine to support related components of the module of the pre-manufactured machine (e.g., battery, drive motherboard and the like). The screw holes 200 may be disposed on the side of the second support part 102 away from the foldable display panel 20, thereby being convenient for the structure installation and positioning in a subsequent process.

Optionally, as shown in FIGS. 21 and 22, along the direction Z perpendicular to the plane where the foldable display panel 20 is located, a depth D3 of the screw hole 200 may be less than the thickness D2 of the second support part 102.

In one embodiment, it may further describe that the depth of the screw hole 200 disposed on the side of the second support part 102 away from the foldable display panel 20 may be less than the thickness D2 of the second support part 102. That is, the screw hole 200 may not pass through the second support part 102, which may avoid damaging the flatness of the side of the second support part 102 facing toward the foldable display panel 20.

Figure 23:
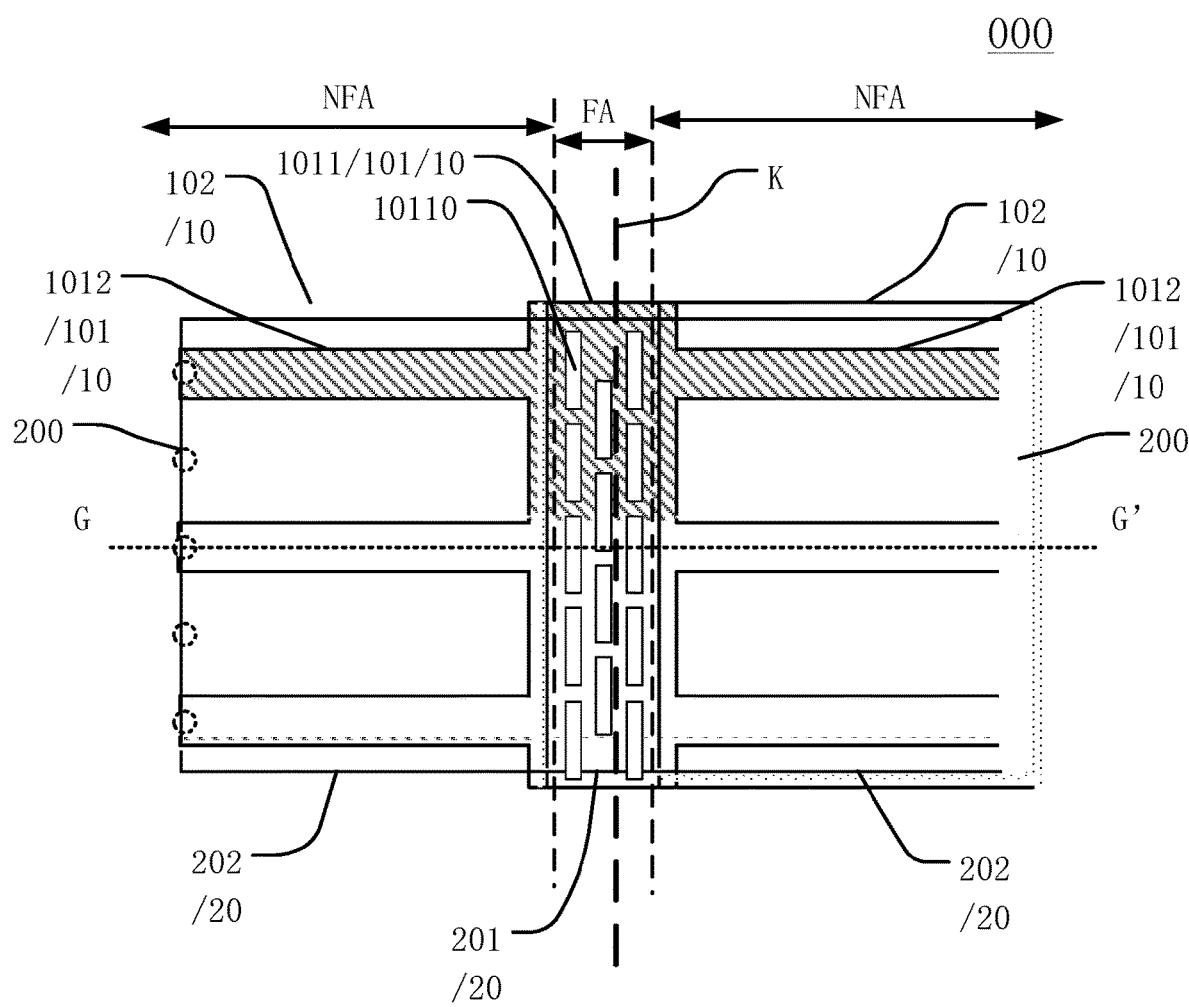
FIG. 23 illustrates a planar structural schematic of another foldable display module according to various embodiments of the present disclosure.
Figure 24:
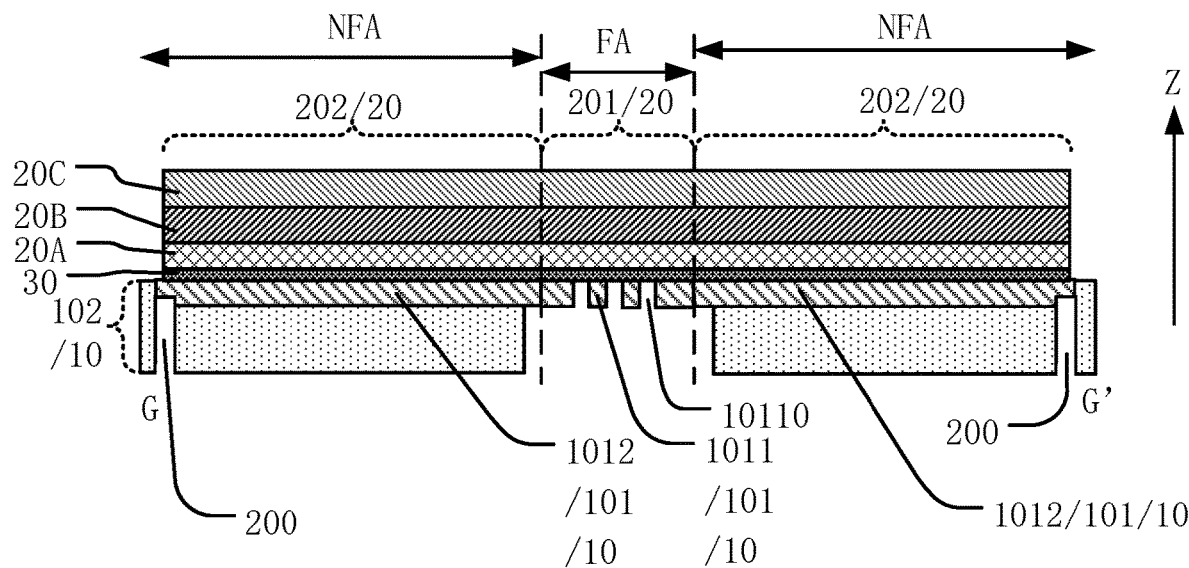
FIG. 24 illustrates a cross-sectional structural schematic along a G-G' direction in FIG. 23.

In some optional embodiments, referring to FIGS. 23-24, FIG. 23 illustrates a planar structural schematic of another foldable display module according to various embodiments of the present disclosure; and FIG. 24 illustrates a cross-sectional structural schematic along a G-G' direction in FIG. 23. In order to clearly illustrate the structure in one embodiment, the transparency filling may be performed on the foldable display panel and the support plate in FIG. 23. In one embodiment, the second portion 1012 of the first support part 101 connected to the first portion 1011 may include a plurality of first sub-portions 10121 discretely disposed; the first sub-portion 10121 may be strip-shaped; and the strip-shaped first sub-portion 10121 may extend from the bendable region FA to the position of the screw hole 200 at the edge of the non-bendable region NFA on the side away from the bendable region FA.

In one embodiment, it may describe that the strip-shaped first sub-portion 10121 may extend toward the edge of the non-bendable region NFA on the side away from the bendable region FA as possible, and may be connected to the screw hole 200 disposed on the side of the second support part 102 away from the foldable display panel 20, which may be beneficial for achieving a desirable heat dissipation effect through the strip-shaped first sub-portion 10121; and the first sub-portion 10121 made of the metal material may be in direct contact with the screw in the screw hole 200 in a subsequent process, thereby being grounded after the pre-manufactured machine is installed.

Figure 25:
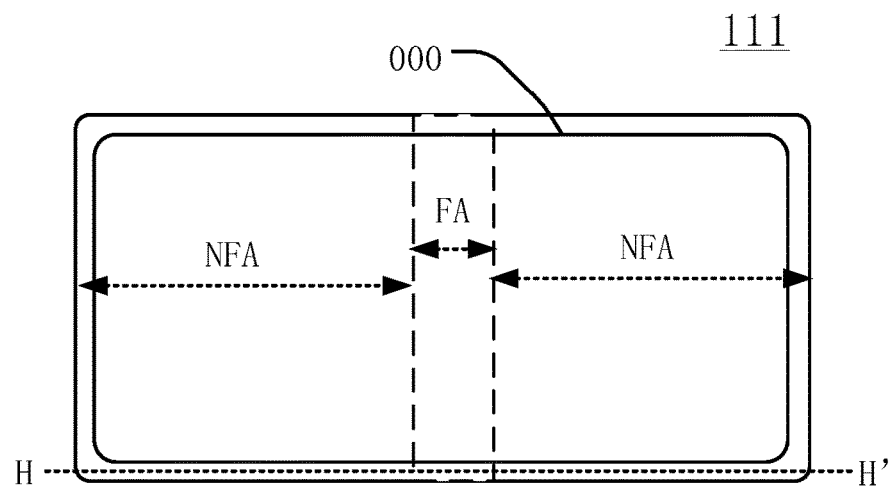
FIG. 25 illustrates a planar structural schematic of a foldable display device according to various embodiments of the present disclosure.
Figure 26:
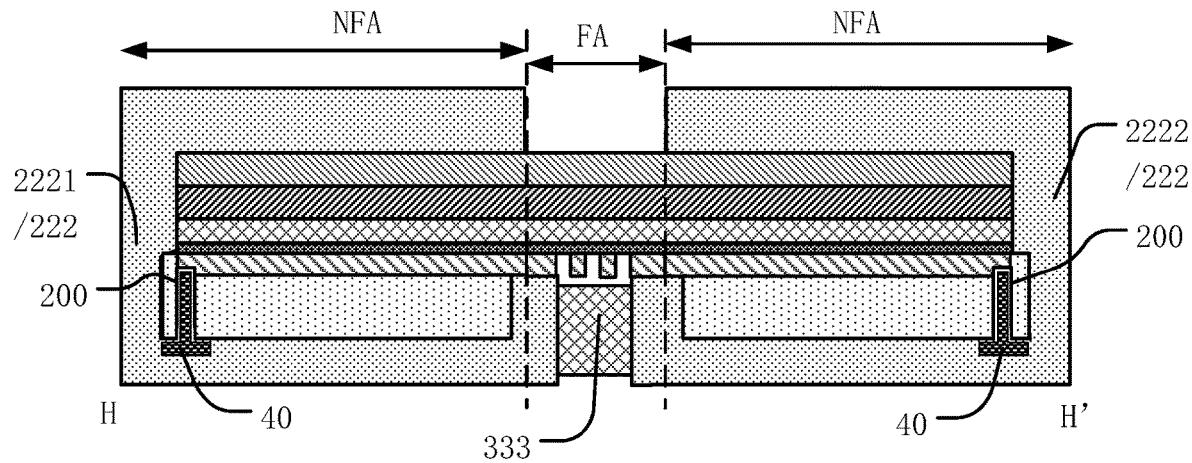
FIG. 26 illustrates a cross-sectional structural schematic along an H-H' direction in FIG. 25.
Figure 27:
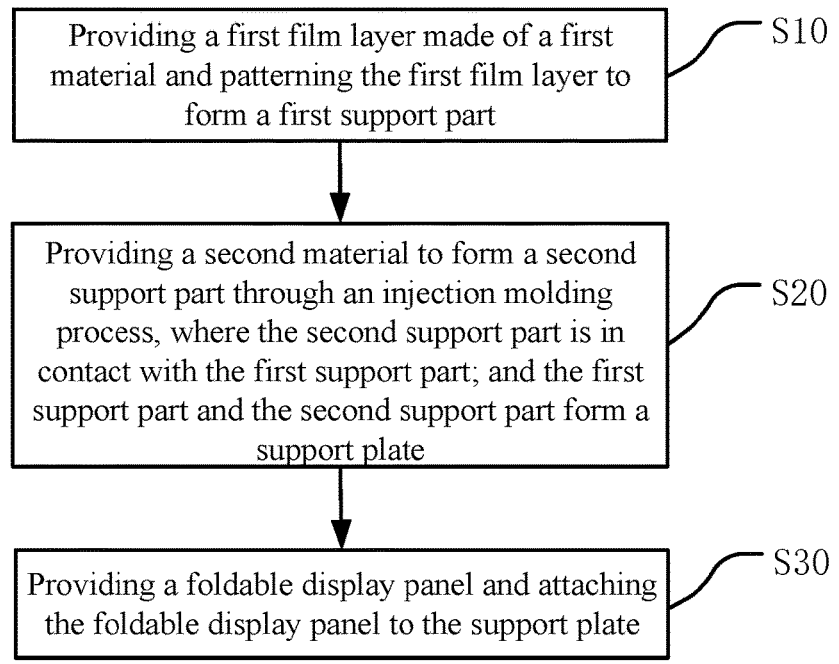
FIG. 27 illustrates a flow chart of a formation method of a foldable display module according to various embodiments of the present disclosure.

In some optional embodiments, referring to FIGS. 1-26, FIG. 25 illustrates a planar structural schematic of the foldable display device according to various embodiments of the present disclosure; and FIG. 26 illustrates a cross-sectional structural schematic along an H-H' direction in FIG. 25. The foldable display device 111 provided in one embodiment may include the foldable display module 000 provided in the above-mentioned embodiments of the present disclosure and a housing 222; the foldable display module 000 may be fixed to the housing 222. Optionally, the foldable display module 000 may be fixed to the housing 222 through screws 40 disposed in the screw holes 200, and the housing 222 may be used to protect the entire foldable display module 000. In one embodiment, a mobile phone may be used as an example to illustrate the foldable display device 111 in FIG. 25. It should be understood that the foldable display device 111 provided by various embodiments of the present disclosure may be other foldable display devices 111 with display functions, such as computers, TVs, vehicle-mounted display devices and the like, which may not be limited according to various embodiments of the present disclosure. The foldable display device 111 provided by various embodiments of the present disclosure may have the beneficial effects of the foldable display module 000 provided by various embodiments of the present disclosure. Details may refer to the description of the foldable display module 000 in the above-mentioned embodiments, which may not be limited according to various embodiments of the present disclosure.

In some optional embodiments, referring to FIGS. 1-26, the foldable display device 111 may further include a hinge 333; the housing 222 may include a first housing 2221 and a second housing 2222; and the first housing 2221 may be connected to the second housing 2222 through the hinge 333.

The foldable display module 000 may include two non-bendable regions NFA and one bendable region FA located between the two non-bendable regions NFA.

The support plate 10 of the foldable display module 000 may include two second support parts 102 which are respectively located in the two non-bendable regions NFA.

Two second support parts 102 may be fixedly connected to the first housing 2221 and the second housing 2222 by the screws 40, respectively.

In one embodiment, it may describe that the foldable display module 000 may include two non-bendable regions NFA and one bendable region FA located between the two non-bendable regions NFA; the support plate 10 of the foldable display module 000 may include two second support parts 102, which are respectively located in the two non-bendable regions NFA; the housing 222 may include the first housing 2221 and the second housing 2222; the first housing 2221 may be connected to the second housing 2222 through the hinge 333; the hinge 333 may be located in the bendable region FA; and the bending function may be realized through the hinge 333. Two second support parts 102 may be respectively fixedly connected to the first housing 2221 and the second housing 2222 through a plurality of screws 40 and screw holes 200, thereby ensuring the structural stability of the entire display device.

It should be understood that, in one embodiment, the shape of the hinge 333 may not be shown in FIG. 26, and may be understood according to the structure of the hinge capable of realizing the folding function in the folding display device in the existing technology during actual implementation, which may not be repeated in detail in one embodiment.

In some optional embodiments, referring to FIGS. 1-27, FIG. 27 illustrates a flow chart of a formation method of the foldable display module according to various embodiments of the present disclosure. The formation method provided in one embodiment may be used to form the foldable display module 000 in the above-mentioned embodiments. The formation method may include the following steps.

In S10, a first film layer 00 made of the first material may be provided, and the first film layer 00 may be patterned to form the first support part 101.

In S20, the second material may be provided to form the second support part 102 through an injection molding process, where the second support part 102 may be in contact with the first support part 101; and the first support part 101 and the second support part 102 may form the support plate 10.

In S30, the foldable display panel 20 may be provided; and the foldable display panel 20 may be attached to the support plate 10.

For example, the formation method of the foldable display module provided in one embodiment may include the following steps.

Figure 28:
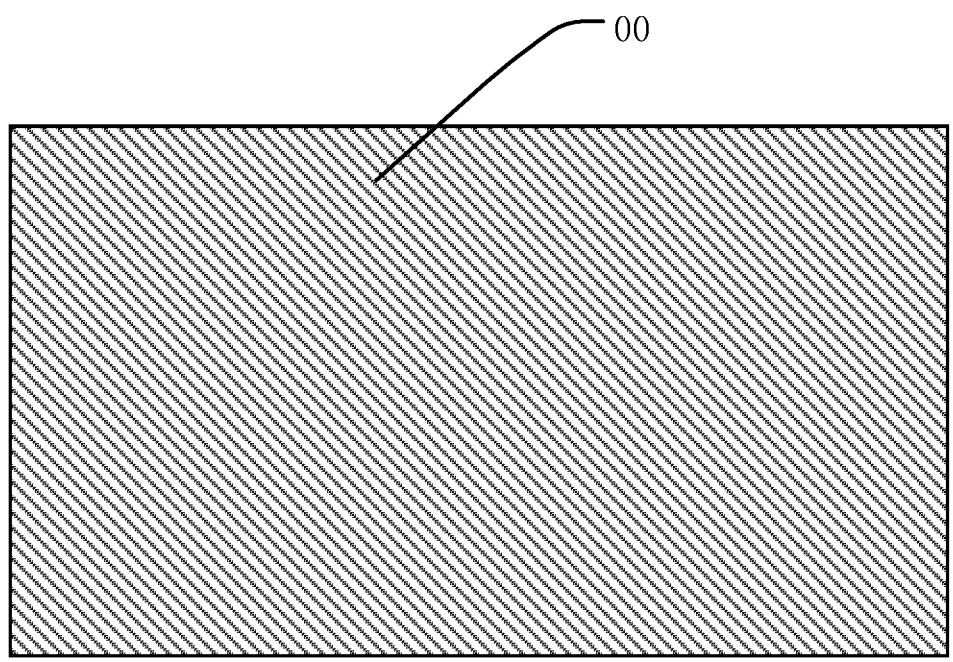
FIG. 28 illustrates a planar structural schematic of a first film layer according to various embodiments of the present disclosure.
Figure 29:
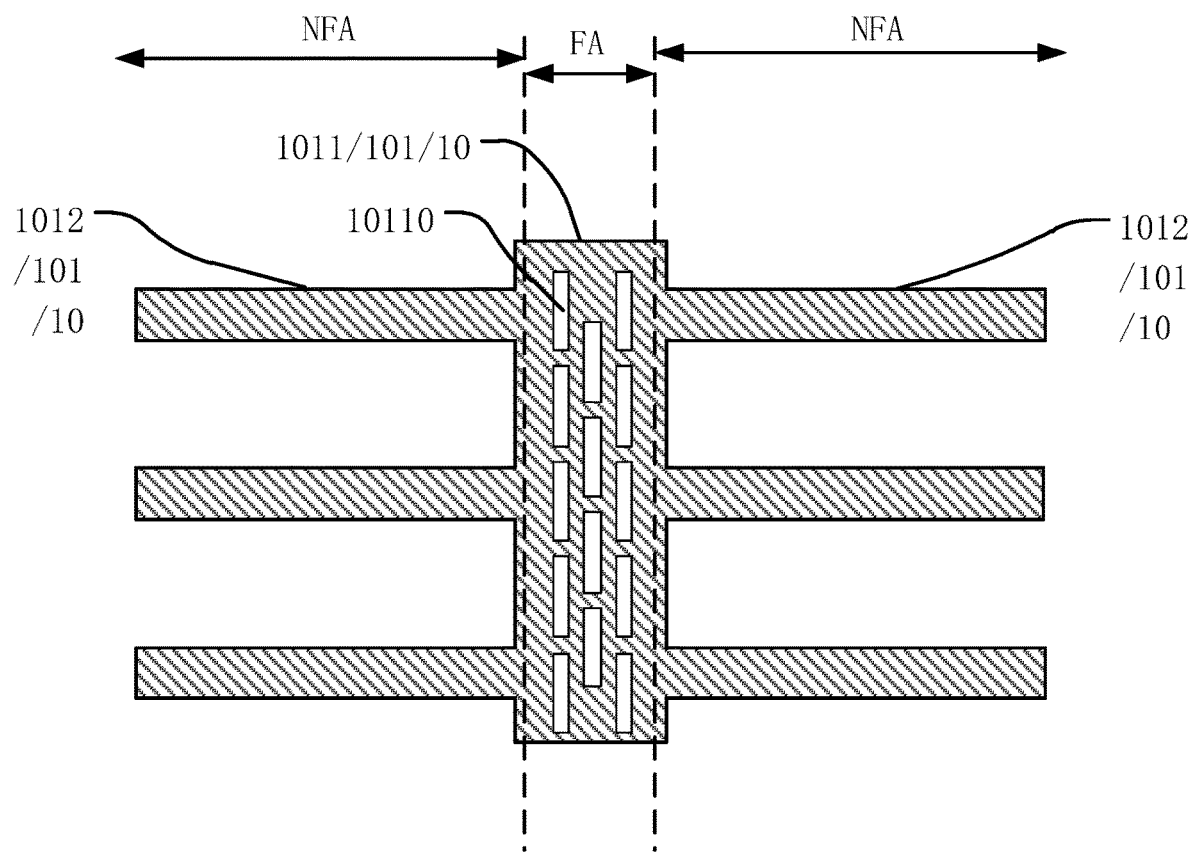
FIG. 29 illustrates a planar structural schematic of a first support part after patterning a first film layer according to various embodiments of the present disclosure.

In S10, as shown in FIGS. 28-29, FIG. 28 illustrates a planar structural schematic of the first film layer according to various embodiments of the present disclosure; FIG. 29 illustrates a planar structural schematic of the first support part after patterning the first film layer according to various embodiments of the present disclosure; the first film layer 00 made of the first material may be provided (as shown in FIG. 28), and the first film layer 00 may be patterned to form the first support part 101 (as shown in FIG. 29). The formed first support part 101 may be any structure of the first support part 101 in the above-mentioned embodiments. In one embodiment, the following may be taken as an example for illustration in FIG. 29: the first support part 101 may include the first portion 1011 and the second portion 1012 which form a single piece structure; the second portion 1012 may include the plurality of first sub-portions 10121 located in the non-bendable region NFA, and the first sub-portions 10121 may be strip-shaped; the extension direction of the strip-shaped first sub-portion 10121 may extend along the arrangement direction of the bendable region FA and the non-bendable region NFA; and the first portion 1011 of the first support part 101 may be disposed with the plurality of hollowed structures 10110.

Figure 30:
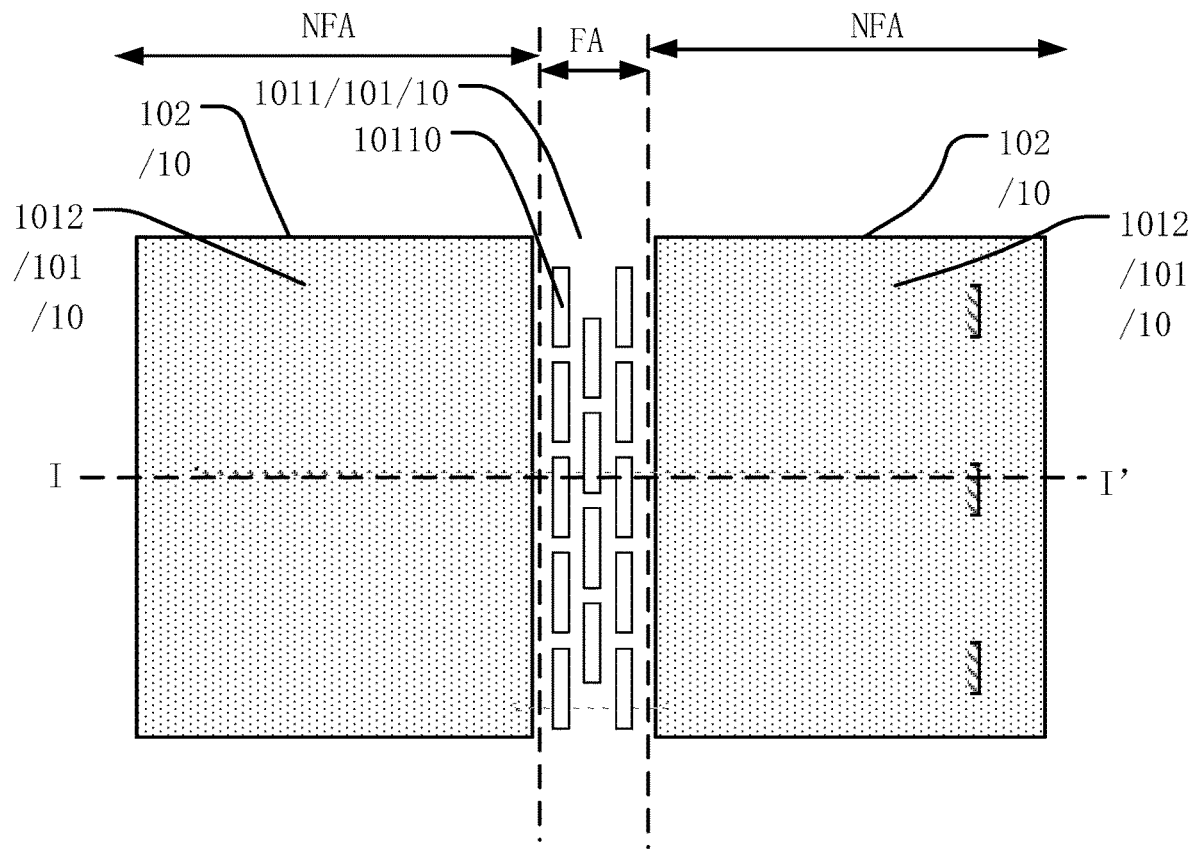
FIG. 30 illustrates a planar structural schematic of a formed support plate according to various embodiments of the present disclosure.
Figure 31:
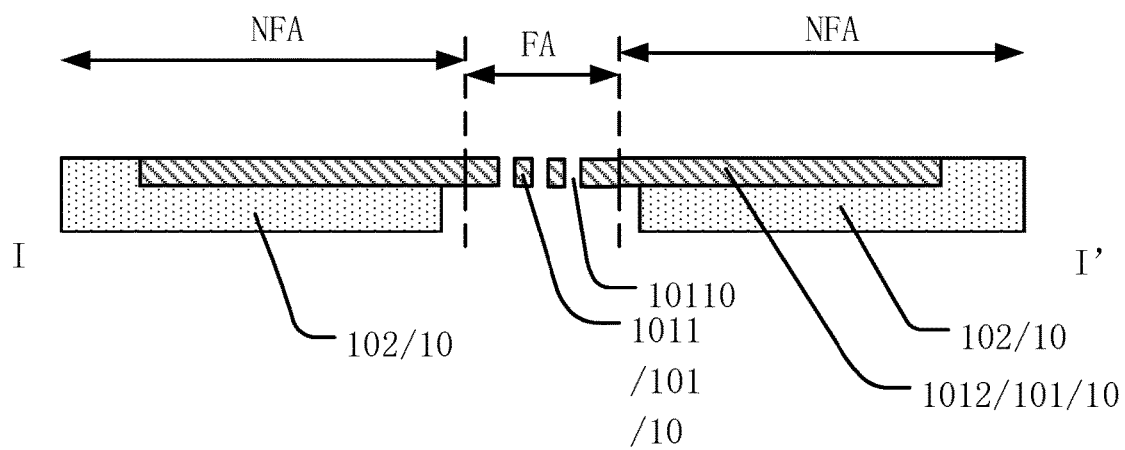
FIG. 31 illustrates a cross-sectional structural schematic along an I-I' direction in FIG. 30.

In S20, as shown in FIGS. 30-31, FIG. 30 illustrates a planar structural schematic of the formed support plate according to various embodiments of the present disclosure; FIG. 31 illustrates a cross-sectional structural schematic along an I-I' direction in FIG. 30; the second material may be provided to form the second support part 102 through an injection molding process, where the second support part 102 may be in contact with the first support part 101, and the first support part 101 and the second support part 102 may form the support plate 10. The formed support plate 10 may be any structure of the support plate 10 in the above-mentioned embodiments. In one embodiment, the fitting and fixation of first support part 101 and the second support part 102 may be taken as an example for illustration in FIGS. 30-31.

Figure 32:
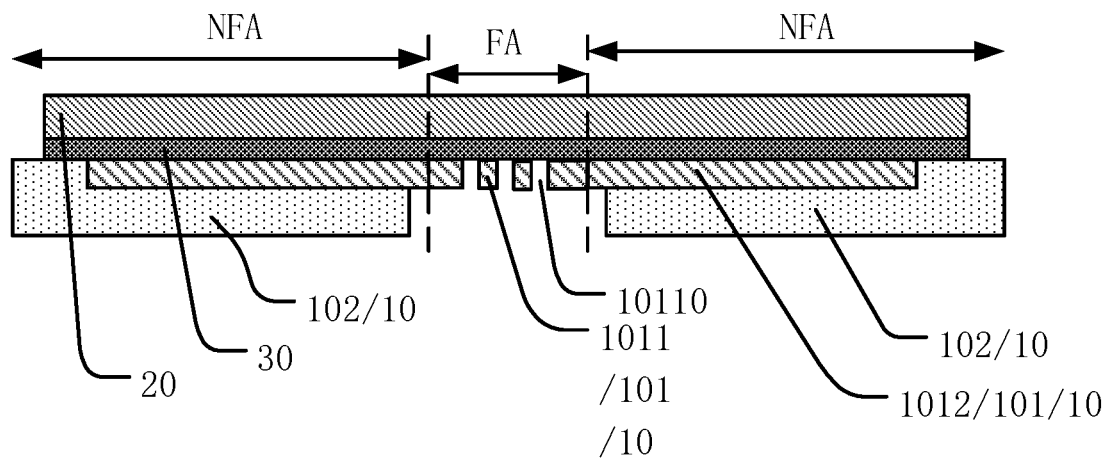
FIG. 32 illustrates a structural schematic after a foldable display panel and a support plate are attached according to various embodiments of the present disclosure.
Figure 33:
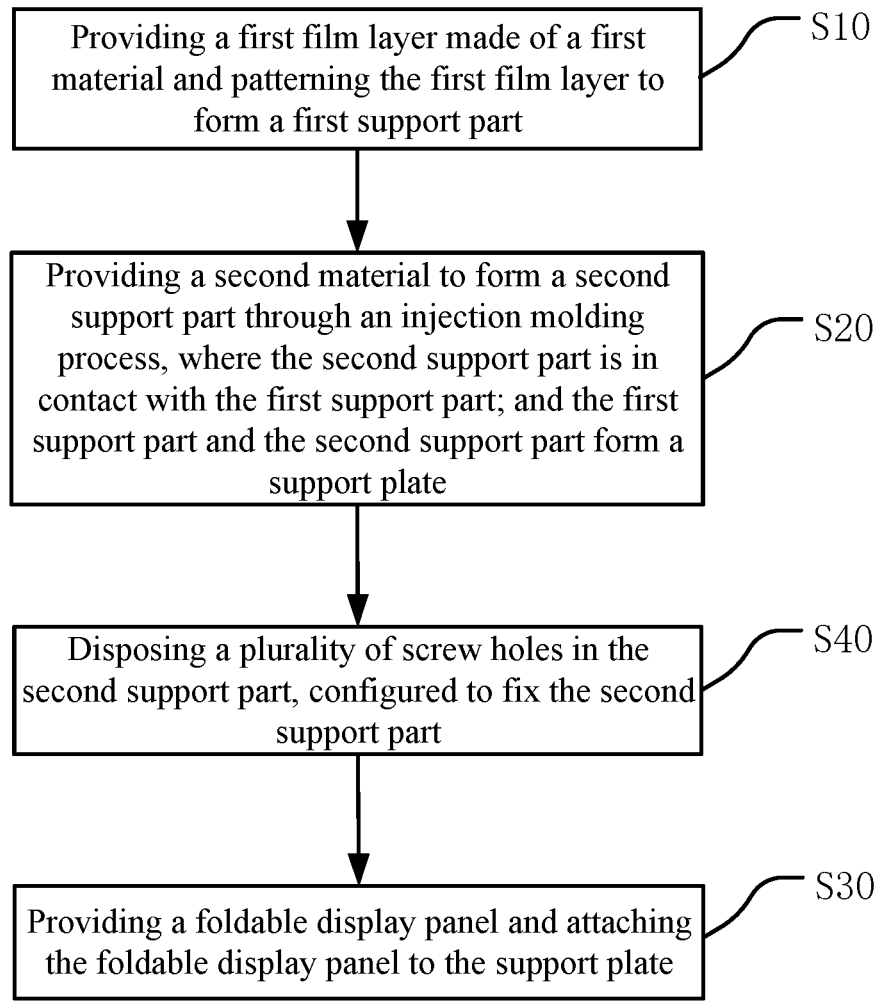
FIG. 33 illustrates another flow chart of a formation method of a foldable display module according to various embodiments of the present disclosure.

In S30, as shown in FIG. 32, FIG. 32 illustrates a structural schematic after the foldable display panel and the support plate are attached according to various embodiments of the present disclosure; the foldable display panel 20 may be provided; and the foldable display panel 20 may be attached to the support plate 10. Optionally, the foldable display panel 20 may be attached to the support plate 10 through the optical adhesive layer 30.

In some optional embodiments, referring to FIGS. 1-26 and FIG. 33, FIG. 33 illustrates another flow chart of a formation method of the foldable display module according to various embodiments of the present disclosure. The formation method provided in one embodiment may be used to form the foldable display module 000 in the above-mentioned embodiments. The formation method may include the following steps.

In S10, the first film layer 00 made of the first material may be provided, and the first film layer 00 may be patterned to form the first support part 101, as shown in FIGS. 28-29.

In S20, the second material may be provided to form the second support part 102 through an injection molding process, where the second support part 102 may be in contact with the first support part 101; and the first support part 101 and the second support part 102 may form the support plate 10, as shown in FIGS. 30 and 31.

Figure 34:
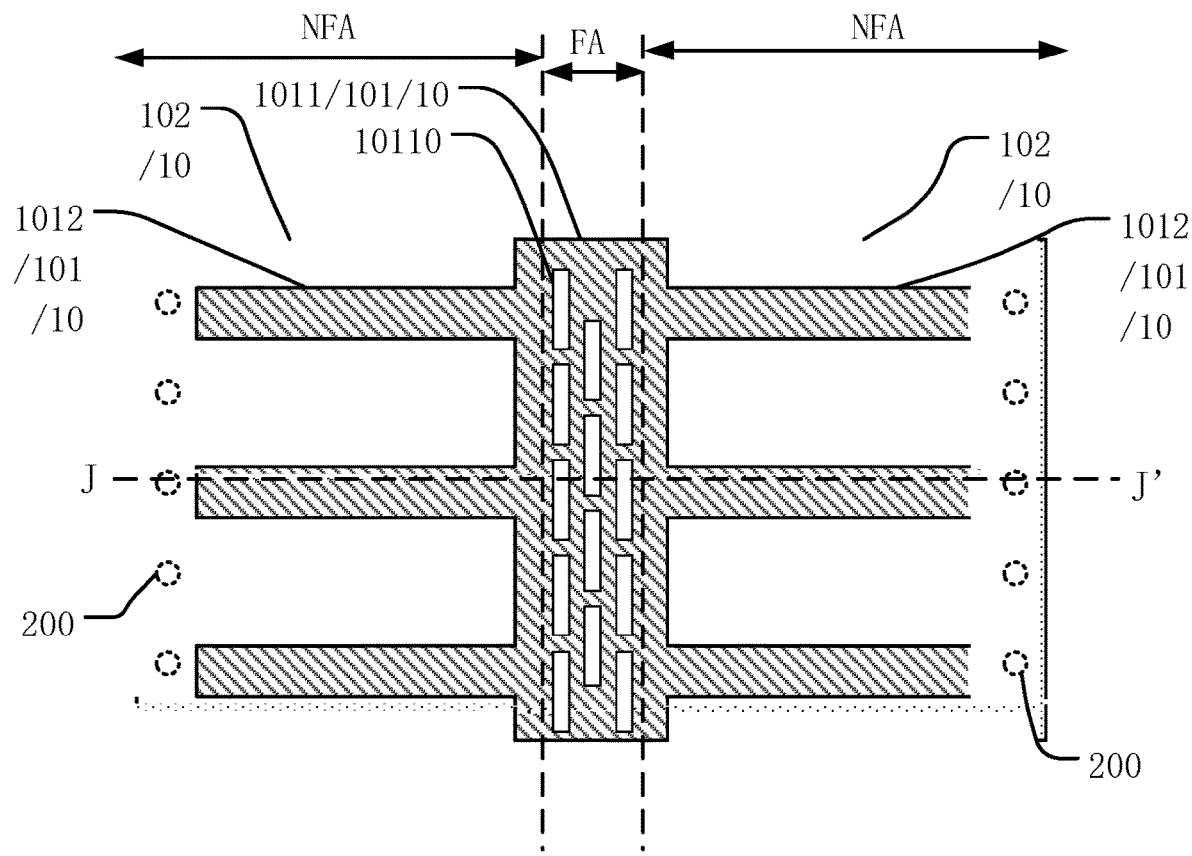
FIG. 34 illustrates a planar structural schematic of a formed support plate disposing with screw holes in a second support part according to various embodiments of the present disclosure.
Figure 35:
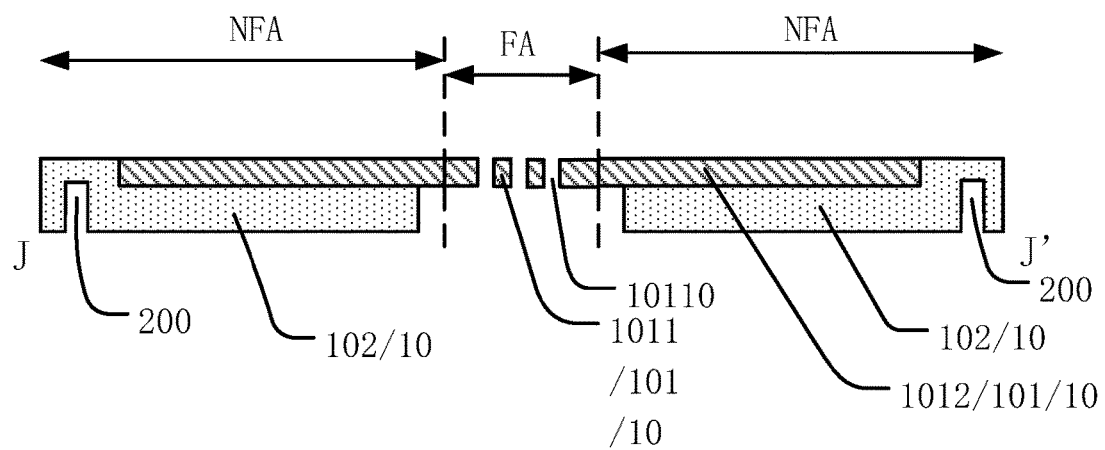
FIG. 35 illustrates a cross-sectional structural schematic along a J-J' direction in FIG. 34.

In S40, the plurality of screw holes 200 are disposed in the second support part 102 for fixing the second support part 102, as shown in FIGS. 34-35. FIG. 34 illustrates a planar structural schematic of the formed support plate disposing with screw holes in the second support part according to various embodiments of the present disclosure; and FIG. 35 illustrates a cross-sectional structural schematic along a J-J' direction in FIG. 34.

Figure 36:
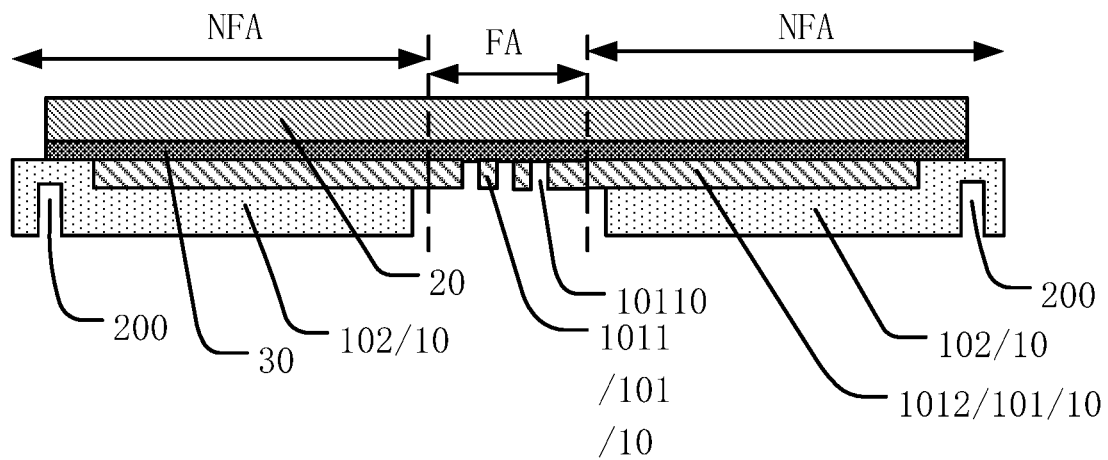
FIG. 36 illustrates another structural schematic after a foldable display panel and a support plate are attached according to various embodiments of the present disclosure.

In S30, the foldable display panel 20 may be provided; and the foldable display panel 20 may be attached to the support plate 10, as shown in FIG. 36. FIG. 36 illustrates another structural schematic after the foldable display panel and the support plate are attached according to various embodiments of the present disclosure.

The formation method of the foldable display module provided in one embodiment may further include, before attaching the foldable display panel 20 to the support plate 10, disposing the plurality of screw holes 200 in the second support part 102 to fix the second support part 102 (as shown in FIGS. 34-35). Optionally, the plurality of screw holes 200 may be disposed on the side of the second support part 102 away from the first support part 101 to ensure the flatness of the support surface of the support plate 10, thereby being convenient for the structure installation and positioning in a subsequent formation process.

From the above-mentioned embodiments, it can be seen that the foldable display module and its formation method, and the foldable display device provided by the present disclosure may achieve at least the following beneficial effects.

The foldable display module provided in various embodiments of the present disclosure may include the foldable display panel and the support plate to support the foldable display panel; and the support plate may be located on the side away from the light-exiting surface of the foldable display panel. The foldable display module may include the bendable region and the non-bendable region. The foldable display panel may include the bendable portion and the non-bendable portion, where the bendable portion may be located in the bendable region; and the non-bendable portion may be located in the non-bendable region. Therefore, the foldable feature of the foldable display module may be realized by configuring the bendable portion of the foldable display panel being located in the bendable region of the foldable display module. The support plate may include the first support part and the second support part; the first support part may be made of the first material; and the second support part may be made of the second material. The first support part may include the first portion; the first portion may be used to support the bendable portion of the foldable display panel; and the second support part may be used to support the non-bendable portion of the foldable display panel. Optionally, the densities of the first material and the second material may be different. The support plate in various embodiments of the present disclosure may include two different materials; and the first support part and the second support part made of two different materials may be used to jointly support the foldable display panel. By configuring the second support part made of the second material, not only the weight of the entire module can be reduced, but also the support plate can have desirable support performance in the non-bendable region. Furthermore, by configuring the first support part made of the first material, the foldable display module may have desirable flatness in the bendable region, which may reduce the module weight and make the module have desirable flatness and bendability as possible.

Although some embodiments of the present disclosure have been described in detail through examples, those skilled in the art should understand that the above-mentioned examples may be merely for illustration and not for limiting the scope of the present disclosure. Those skilled in the art should understand that the above-mentioned embodiments may be modified without departing from the scope and spirit of the present disclosure. The scope of the present disclosure may be defined by the appended claims.

What is claimed is:

1. A foldable display module, comprising:
a foldable display panel and a support plate which are disposed oppositely, wherein:
the support plate is on a side away from a light-exiting surface of the foldable display panel;
the support plate includes a first support part and a second support part; the first support part is made of a first material; and the second support part is made of a second material;
the foldable display module includes a bendable region and a non-bendable region;
the foldable display panel includes a bendable portion and a non-bendable portion; the bendable portion is at the bendable region; and the non-bendable portion is at the non-bendable region;
the first support part includes a first portion configured to support the bendable portion of the foldable display panel;
the second support part is configured to support the non-bendable portion of the foldable display panel; and
the first support part is in contact with the second support part, and a first support surface of the first portion of the first support part facing toward a side of the foldable display panel does not overlap with a second support surface of the second support part facing toward the side of the foldable display panel.

2. The module according to claim 1, wherein:
a density of the first material is greater than a density of the second material.

3. The module according to claim 1, wherein:
an elastic modulus of the first material is less than an elastic modulus of the second material.

4. The module according to claim 1, wherein:
the first material includes a metal material, and the second material includes a plastic material.

5. The module according to claim 1, wherein:
the first material includes a metal material, and the second support part includes a biaxially stretched thin film.

6. The module according to claim 1, wherein:
the first support part includes the first support surface facing toward a side of the foldable display panel;
the second support part includes the second support surface facing toward the side of the foldable display panel; and
the first support surface does not overlap the second support surface.

7. The module according to claim 6, wherein:
the first support surface and the second support surface are in a same plane.

8. The module according to claim 1, wherein:
the first support part and the second support part form a single piece structure.

9. The module according to claim 1, wherein:
the first support part further includes a second portion; the second portion is connected to the first portion; and the second portion includes a portion at the non-bendable region.

10. The module according to claim 9, wherein:
the second support part is fitted with the second portion of the first support part.

11. The module according to claim 10, wherein:
a groove is formed on a side of the second support part facing toward the foldable display panel, and the second portion of the first support part is at the groove.

12. The module according to claim 9, wherein:
the second portion includes a plurality of sub-portions discretely disposed at the non-bendable region; and the plurality of sub-portions is strip-shaped and extends in an arrangement direction along the bendable region and the non-bendable region; or
the second portion includes a plurality of sub-portions discretely disposed at the non-bendable region; each sub-portion of the plurality of sub-portions includes a main portion and a plurality of branches connected to the main portion; and the main portion is strip-shaped and extends in an arrangement direction along the bendable region and the non-bendable region; or
the second portion is mesh-shaped, and a position of a mesh-shaped grid exposes the second support part.

13. The module according to claim 12, wherein:
the second support part includes a single piece structure.

14. The module according to claim 1, wherein:
the first portion of the first support part is disposed with a plurality of hollowed structures.

15. The module according to claim 1, wherein:
a thickness of the second support part is greater than or equal to a thickness of the first support part.

16. The module according to claim 15, wherein:
the thickness of the first support part is from about 100 μm to about 300 μm, and the thickness of the second support part is from about 100 μm to about 1000 μm.

17. A foldable display device, comprising:
a housing; and
a foldable display module comprising a foldable display panel and a support plate which are disposed oppositely, wherein:
  the support plate is on a side away from a light-exiting surface of the foldable display panel;
  the support plate includes a first support part and a second support part; the first support part is made of a first material; and the second support part is made of a second material;
  the foldable display module includes a bendable region and a non-bendable region;
  the foldable display panel includes a bendable portion and a non-bendable portion; the bendable portion is at the bendable region; and the non-bendable portion is at the non-bendable region;
  the first support part includes a first portion configured to support the bendable portion of the foldable display panel;
  the second support part is configured to support the non-bendable portion of the foldable display panel;
  the first support part is in contact with the second support part, and a first support surface of the first portion of the first support part facing toward a side of the foldable display panel does not overlap with a second support surface of the second support part facing toward the side of the foldable display panel; and
  the foldable display module is fixed to the housing.

18. The display device according to claim 17, further including:
a hinge, wherein:
  the housing includes a first housing and a second housing; and the first housing is connected to the second housing through the hinge;
  the foldable display module includes two non-bendable regions and one bendable region between the two non-bendable regions;
  the support plate of the foldable display module includes two second support parts which are respectively at two non-bendable regions; and
  the two second support parts are fixedly connected to the first housing and the second housing by screws, respectively.

19. A formation method of a foldable display module, comprising:
providing a first film layer made of a first material and patterning the first film layer to form a first support part;
providing a second material to form a second support part through an injection molding process, wherein the second support part is in contact with the first support part; a first support surface of the first portion of the first support part facing toward a side of the foldable display panel does not overlap with a second support surface of the second support part facing toward the side of the foldable display panel; and the first support part and the second support part form a support plate; and
providing a foldable display panel and attaching the foldable display panel to the support plate.

20. The method according to claim 19, before attaching the foldable display panel to the support plate, further including:
disposing a plurality of screw holes in the second support part, configured to fix the second support part.

* * * * *